United States Patent
Stolper et al.

(10) Patent No.: US 9,910,082 B2
(45) Date of Patent: Mar. 6, 2018

(54) APPARATUS, METHODS AND SYSTEMS FOR MEASURING AND DETECTING ELECTRICAL DISCHARGE

(71) Applicant: CSIR, Pretoria, Gauteng (ZA)

(72) Inventors: Geert Roelf Stolper, Pretoria (ZA); Robert Anderson Schutz, Johannesburg (ZA)

(73) Assignee: CSIR, Pretoria (ZA)

( * ) Notice: Subject to any disclaimer, the term of this patent is extended or adjusted under 35 U.S.C. 154(b) by 293 days.

(21) Appl. No.: 14/775,479

(22) PCT Filed: Mar. 13, 2014

(86) PCT No.: PCT/IB2014/059714
§ 371 (c)(1),
(2) Date: Sep. 11, 2015

(87) PCT Pub. No.: WO2014/141116
PCT Pub. Date: Sep. 18, 2014

(65) Prior Publication Data
US 2016/0025799 A1     Jan. 28, 2016

(30) Foreign Application Priority Data

Mar. 13, 2013    (ZA) .................................. 2013/01905

(51) Int. Cl.
*G01R 31/00*     (2006.01)
*G01R 31/12*     (2006.01)
*G06F 11/30*     (2006.01)

(52) U.S. Cl.
CPC ............................... *G01R 31/1218* (2013.01)

(58) Field of Classification Search
CPC ................................................. G01R 31/1218
See application file for complete search history.

(56) References Cited

U.S. PATENT DOCUMENTS 3,641,348 A    2/1972   Schwarz
5,637,871 A *   6/1997   Piety .................... G01J 5/02
                                                                            250/330

(Continued)

FOREIGN PATENT DOCUMENTS

WO    WO 2007/069212 A2    6/2007

OTHER PUBLICATIONS

International Search Report and Written Opinion in International Patent Application No. PCT/IB2014/059714 dated Mar. 3, 2015.

(Continued)

*Primary Examiner* — Phuong Huynh
(74) *Attorney, Agent, or Firm* — Knobbe Martens Olson & Bear LLP

(57) ABSTRACT

The invention relates to an apparatus, method and system for measuring and optionally detecting an electrical discharge having a discharge magnitude, wherein the electrical discharge causes a corresponding emission of optical radiation. The apparatus embodies the system and method in accordance with the invention, wherein the method comprises measuring electrical discharge by firstly storing pre-determined calibration data comprising calibrated quantitative measurement values associated with magnitudes of electrical discharge and detector parameters corresponding thereto, the detector parameters being operating parameters associated with the optical detector, receiving and processing a particular detector parameter with the stored calibration data to detect an electrical discharge, and determine a quantitative measurement associated with the magnitude of the detected electrical discharge.

20 Claims, 14 Drawing Sheets

(56) References Cited

U.S. PATENT DOCUMENTS 7,787,113 B2 * 8/2010 Aiello ..................... G01J 1/04
356/237.1
2007/0268482 A1 11/2007 Aiello

OTHER PUBLICATIONS

International Preliminary Report on Patentability in International Patent Application No. PCT/IB2014/059714 dated Sep. 15, 2015.

* cited by examiner

APPARATUS, METHODS AND SYSTEMS FOR MEASURING AND DETECTING ELECTRICAL DISCHARGE

BACKGROUND OF THE INVENTION

THIS INVENTION relates to an apparatus, methods and systems for measuring determining electrical discharge, for example, corona discharge, remotely.

Undesirable electrical discharges often occur as potential fault indicators at high voltage equipment such power lines, transformers and insulators at sub-stations. One type of electrical discharge, a corona discharge, is a phenomenon that results, for example, from the ionising of air surrounding high voltage equipment by a high electric field that forms around the equipment. Corona discharges occur for various reasons, however, in many cases this is due to defective or poorly designed high voltage electrical equipment such as high voltage insulators and bushings, power transmission lines and substations, etc. Corona discharges often undesirably result in breakdown of electrical equipment which in turn could result in power outages and production losses at factories. In addition, the presence of corona discharges, particularly large corona discharges, provides dangerous and potentially life threatening working conditions for those working with the high voltage equipment, for example, life line workers working on the equipment for maintenance, inspection, etc. For the high voltage engineer corona is a pre-cursor to an insulation problem.

It follows that it is desirable to detect and measure corona discharges at least to identify potential problems and ameliorate undesirable issues associated therewith. However, a problem exists in that the phenomenon of corona occurs at equipment of 10 kilovolts voltage and higher and out of reach which makes the phenomenon difficult to access or measure exactly and accurately. It is not possible to make an electrical connection at high voltage equipment and measure with a meter the actual corona level.

Though the above difficulties and problems have been addressed previously by conventional non-contact apparatuses and systems by optical means and devices, the present invention seeks at least to address the abovementioned difficulties and problems in a different manner.

SUMMARY OF THE INVENTION

According to a first aspect of the invention, there is provided an apparatus for detecting and measuring an electrical discharge having a discharge magnitude, wherein the electrical discharge causes a corresponding emission of optical radiation, the apparatus comprising:
an optical receiver arrangement configured to receive optical radiation from a scene comprising a source of a potential electrical discharge;
a first image forming means configured to form an image based on the optical radiation received by the optical receiver arrangement;
a measurement system comprising:
an optical detector optically coupled to the optical receiver arrangement to receive and process the optical radiation from the optical receiver arrangement to generate a detector output;
a memory device storing pre-determined calibration data comprising calibrated quantitative measurement values associated with magnitudes of electrical discharge and detector parameters corresponding thereto, the detector parameters being operating parameters associated with the optical detector; and
a quantitative measurement module configured to receive and process a particular detector parameter with the stored calibration data thereby to detect an electrical discharge, and determine a quantitative measurement associated with the magnitude of the detected electrical discharge;
a display device for displaying images formed by the first image forming means; and
an image processor configured to overlay the determined quantitative measurement onto the image displayed by the display device.

The quantitative measurement module may be configured to process the received detector parameter with the stored calibration data by:
comparing the received detector parameter with detector parameters forming part of the calibration data;
retrieving, upon a match, a calibrated quantitative measurement value corresponding to the matching detector parameter, wherein a match results in a detection of an electrical discharge, and
optionally use the retrieved calibrated quantitative measurement value to determine the quantitative measurement associated with the magnitude of the detected electrical discharge The apparatus may be in the form of a portable camera comprising a power supply; portable housing defining at least one optical aperture such that optical radiation emanating from outside the portable housing enters the housing, wherein the housing encloses the components of the apparatus; and at least one eye piece visually alignable with the display device to permit viewing of the same.

The optical receiver arrangement may comprise:
a light-collector comprising one or more optical lenses and/or filters to receive optical radiation; and
a beam splitter optically coupled to the light-collector and configured to reflect all or part of the spectrum of the received optical radiation to the image forming means and to the measurement system.

The apparatus may comprise a distance determining means configured to determine a distance between the apparatus and the potential electrical discharge or the source thereof, wherein the quantitative measurement module may be configured to use the determined distance and the calibrated quantitative measurement value associated with the received detector parameter to determine the quantitative measurement of the detected electrical discharge; and optionally wherein the quantitative measurement module may be configured to apply an atmospheric correction factor in determining the quantitative measurement of the detected electrical discharge.

The apparatus may be calibrated to a calibration source of optical radiation, the calibrated quantitative measurement values being one or more of temperature, irradiance, and power associated with the calibration source; and wherein the detector parameters forming part of the calibration data correspond to the calibrated quantitative measurement values.

The calibration source may be a black body calibration source; and wherein if the calibrated quantitative measurement value is temperature, the quantitative measurement module may be configured to determine emittance power of the electrical discharge by applying Planck's Black Body Equation:

Total emittance =

$$\underbrace{\int_{240\,nm}^{280\,nm} \frac{2\pi hc^2}{\lambda^5\left(e^{\frac{hc}{\lambda kT}}-1\right)}}_{Planck's\ law} * \underbrace{\frac{\pi r^2}{Black\ body\ aperture}}_{} * \underbrace{\frac{1/\tau_o}{AtmTransmission}}_{} * \underbrace{\left(\frac{d}{d_c}\right)^2}_{Inverse\ square\ law}$$

The optical detector may comprise a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output.

The apparatus may comprise a second image forming means operatively connected to the anode of the optical detector to form an image of the photons output thereby, wherein the image processing means is configured to overlay the image formed by the second image forming means onto the image formed by the first image forming means. It will be noted that the first image forming means may be the image formed and/or displayed via a display device, for example, an LCD (Liquid Crystal Display)/LED (Light Emitting Diode) display screen associated with the camera. The first image forming means may comprise conventional video and/or image circuitry and processor/s to form a conventional visual image of a scene.

In one example embodiment, the measurement system may comprise a current measuring module configured to determine an electrical parameter associated with one of the photocathode and the anode in processing received optical radiation to output photons, and wherein the particular detector parameter received by the quantitative measurement module is the determined electrical parameter. The electrical parameter may be the anode current drawn by the anode of the optical detector in processing the received optical radiation to generate the detector output such that the calibration data comprises a plurality of anode current values and corresponding calibrated quantitative measurement values associated with magnitudes of electrical discharges. In some example embodiments, the electrical parameter may be in the form of one or more of current, voltage, resistance and power associated with the photocathode or the anode.

In another example embodiment of the invention, the memory device may store a pre-determined calibration set point associated with the detector output and/or an electrical parameter associated with one of the photocathode and the anode in processing received optical radiation to generate the detector output, wherein the measurement system may comprise:
 a parameter monitoring module configured to receive information indicative of the detector output and/or the electrical parameter to determine variations of the same from the respective calibration set point; and
 a gain controller module configured to correct or adjust a detector parameter of the optical detector to a corrected detection parameter in response to determining variation of the received detector output and/or electrical parameter from the respective calibration set point so as to maintain a predetermined relationship between detector output and/or electrical parameter and the corresponding calibration set point/s,
 wherein the particular detector parameter receivable for processing by the quantitative measurement module is the corrected detection parameter, and wherein the calibration data comprises detector parameters and corresponding calibrated quantitative measurement values associated with magnitudes of electrical discharges at which the predetermined relationship between the detector output and/or the electrical parameter and the corresponding calibration set point/s is maintained.

The electrical parameter may be anode current drawn by the anode of the optical detector in processing the received optical radiation to generate the detector output, the detector output may be related to a number of photons output by the optical detector, and the detector parameter may be the gain of the optical detector or the gate pulse width applied to the photocathode and therefore the overall time averaged gain of the optical detector, and wherein the calibration data may comprise gain or pulse width values and corresponding calibrated quantitative measurement values associated with magnitudes of electrical discharges at which the detector output and/or the anode current is at or is equal to the corresponding calibration set point/s.

According to a second aspect of the invention, there is provided a method of measuring an electrical discharge having a discharge magnitude, wherein the electrical discharge causes a corresponding emission of optical radiation, the method comprising:
 storing, in a memory device, a pre-determined calibration set point for a detector output and/or an electrical parameter associated with an optical detector, wherein the electrical parameter is associated with the operation of the optical detector;
 storing in the memory device, pre-determined calibration data comprising calibrated quantitative measurement values associated with magnitudes of electrical discharges and corresponding detector parameters associated with operation of the optical detector, wherein the detector parameters forming part of the calibration data are selected to maintain the detector output and/or electrical parameter at the pre-determined calibration set point;
 receiving information indicative of a monitored detector output and/or electrical parameter,
 determining variations of the monitored detector output and/or electrical parameter relative to the associated predetermined calibration set point stored in the memory device in response to exposure of the optical detector to the emission of optical radiation from the electrical discharge;
 correcting or adjusting, if variations are determined, a detector parameter associated with the operation of the optical detector device to a corrected detector parameter so as to maintain the detector output and/or the electrical parameter at the corresponding calibration set point; and
 using the corrected detector parameter and the stored calibration data to determine a quantitative measurement associated with the magnitude of the electrical discharge.

The detector parameter may be a detector gain value or pulse width value associated with the overall time averaged gain of the optical detector, wherein the detector output may be related to a number of photons output by the optical detector, and wherein the calibrated quantitative measurement values may comprise one of temperature and irradiance values associated with electrical discharges. The method may comprise using the corrected detector gain value together with the pre-determined calibration data to determine an amount of input irradiance and/or temperature associated with the electrical discharge received by the optical detector.

The method may comprise a step of providing the optical detector device, the optical detector device comprising a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output.

The electrical parameter may be anode current drawn by the anode of the optical detector in processing the received optical radiation to generate the detector output, the method therefore comprising determining the anode current.

The method may comprise:
using the corrected detector parameter as an input to the calibration data to determine the associated calibrated quantitative measurement value related to the input optical radiation received by the optical detector by matching the corrected detector parameter to one stored in the calibration data and retrieving the calibration quantitative measurement value associated therewith;
determining or measuring a distance to the electrical discharge or source thereof from the optical detector; and
determining the quantitative measurement associated with the magnitude of the electrical discharge by multiplying the retrieved calibrated quantitative measurement value by a square of a distance quotient, wherein the distance quotient is a quotient of the determined distance between the optical detector and the electrical discharge, and a calibrated distance between the optical detector and a source of electrical discharge to which the optical detector was calibrated.

The method may comprise, particularly if the calibrated quantitative value is temperature:
using the retrieved calibrated quantitative measurement value together with Planck's Black Body Formula:

$$\text{Total emittance} = \underbrace{\int_{240\,nm}^{280\,nm} \frac{2\pi h c^2}{\lambda^5 \left(e^{\frac{hc}{\lambda kT}} - 1\right)}}_{\text{Planck's law}} * \underbrace{\pi r^2}_{\text{Black body aperture}} * \underbrace{1/\tau_o}_{\text{AtmTransmission}} * \underbrace{\left(\frac{d}{d_c}\right)^2}_{\text{Inverse square law}}$$

to determine the power of the electrical discharge.

The method may comprise calibrating the optical detector device by:
determining a calibration set point for the detector output and/or the electrical parameter; and
calibrating the detector parameter against varying input optical radiation to keep the detector output and/or electrical parameter of the optical detector constant at the determined calibration set point, wherein the step of calibrating comprises determining the calibration data by determining and storing calibrated quantitative measurement values associated with magnitudes of varying input electrical discharge associated with a calibration source of electrical discharge, and determining and storing associated detector parameters required to keep the detector output and/or electrical parameter constant at the determined set point for each determined and stored calibrated quantitative measurement value.

The calibration data may comprise a calibration curve or look-up table of calibrated quantitative measurement values versus detector parameters, the method may therefore comprise using the corrected detector parameter as an input to the calibration curve or look-up table thereby to determine a corresponding calibrated quantitative measurement value.

The method may comprise correcting or adjusting the gain of the optical detector by operating a multiplier means associated with the optical detector to vary the gain applied thereby, or varying the duty cycle of a gate pulse applied to a photocathode associated with the optical detector thereby to adjust the time averaged gain of the optical detector. In the case of the latter, the gain or voltage of the multiplier means is held constant so as to have constant photon intensity and size through the optical detector.

The method may comprise providing the quantitative measurement in units of watts, photons, or watts per second.

According to a third aspect of the invention, there is provided a system for measuring an electrical discharge having a discharge magnitude, wherein the electrical discharge causes a corresponding emission of optical radiation, the system comprising:
a memory device storing data;
a parameter monitoring module configured to receive information indicative a detector output and/or electrical parameter associated with an optical detector to determine variations thereof relative to an associated predetermined calibration set point in response to exposure of the optical detector to the emission of optical radiation;
a gain controller module configured to correct or adjust a detector parameter of the optical detector to a corrected detector parameter, in response to determining variation of the received detector output and/or electrical parameter, thereby to maintain a predetermined relation between the received detector output and/or electrical parameter and the corresponding calibration set point, wherein the detector parameter is an operating parameter associated with the optical detector; and
a quantitative measurement module configured to use the corrected detector parameter to determine a quantitative measurement associated with the magnitude of the electrical discharge.

The detector parameter may be a detector gain value or pulse width value associated with the overall time averaged gain of the optical detector, and wherein the detector output is or is related to a number of photons output by the optical detector.

The quantitative measurement module may be configured to use the corrected gain value together with pre-determined calibration data stored in the memory device to determine a calibrated quantitative measurement value associated with the optical radiation received by the optical detector, wherein the calibration data comprises calibrated quantitative measurement values associated with magnitudes of electrical discharge and detector parameters corresponding thereto.

The system may comprise a gain determining module configured to determine the corrected gain value.

The system may comprise an image forming means operatively connected to the optical detector for forming an image of the detector output.

The system may comprise the optical detector, the optical detector comprising a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output, wherein the electrical parameter is the current drawn by the anode of the optical detector in providing the detector output, in use.

The system may comprise a distance determining means configured to determine a distance to the electrical discharge or source thereof from the optical detector.

The quantitative measurement module may be configured to:
use the corrected detector parameter as an input to the calibration data to determine the associated calibrated quantitative measurement value related to the input optical radiation received by the optical detector by matching the corrected detector parameter to one stored in the calibration data and retrieving the calibration quantitative measurement value associated therewith; and
receive a distance to the electrical discharge from the distance determining means and determine the quantitative measurement associated with the magnitude of the electrical discharge by multiplying the retrieved calibrated quantitative measurement value by a square of a distance quotient, wherein the distance quotient is a quotient of the determined distance between the optical detector and the electrical discharge, and a calibrated distance between the optical detector and a source of electrical discharge to which the optical detector was calibrated.

The quantitative measurement module may be configured to apply an atmospheric or environmental correction factor to the determined quantitative measurement.

The system may comprise a calibration module configured to determine calibration set points for each of the parameters monitored.

The calibration module may be configured to calibrate the optical detector by calibrating the detector parameter of the same against varying input optical radiation thereby to keep or maintain the detector output and/or electrical parameter at the calibration set point.

The calibration module may be configured to determine the calibration data by determining and storing, in the memory device, calibrated quantitative measurement values associated with magnitudes of varying input electrical discharge associated with a calibration source of electrical discharge, and determining and storing associated detector parameters required to keep the detector output and/or electrical parameter constant at the determined set point for each determined and stored calibrated quantitative measurement value.

The gain controller module may be configured to adjust the gain of the optical detector by operating the multiplier voltage means to vary the gain applied thereby, or the gain controller module may be configured to vary the duty cycle of a gate pulse applied to a photocathode associated with the optical detector thereby in effect adjusting the gain of the optical detector.

According to a fourth aspect of the invention, there is provided a method of measuring an electrical discharge having a discharge magnitude, wherein the electrical discharge causes a corresponding emission of optical radiation, the method comprising:
providing an optical detector to receive and process the optical radiation from the optical receiver arrangement to generate a detector output;
storing, in a memory device, pre-determined calibration data comprising calibrated quantitative measurement values associated with magnitudes of electrical discharge and detector parameters corresponding thereto, the detector parameters being operating parameters associated with the optical detector; and
receiving and processing a particular detector parameter with the stored calibration data thereby to determine a quantitative measurement associated with the magnitude of the detected electrical discharge.

In this example embodiment, the detector parameter may be an electrical parameter associated with the operation of the optical detector, wherein the detector output may be related to a number of photons output by the optical detector, and wherein the calibrated quantitative measurement values comprise one of temperature and irradiance values associated with electrical discharges.

The optical detector may comprise a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output.

The method may comprise determining the electrical parameter, wherein the electrical parameter is the current drawn by the anode and/or photocathode of the optical detector in providing the detector output, in use.

The method may comprise:
using the determined electrical parameter as an input to the calibration data to determine the associated calibrated quantitative measurement value related to the input optical radiation received by the optical detector by matching the determined electrical parameter to one stored in the calibration data and retrieving the calibration quantitative measurement value associated therewith;
determining or measuring a distance to the electrical discharge or source thereof from the optical detector; and
determining the quantitative measurement associated with the magnitude of the electrical discharge by multiplying the retrieved calibrated quantitative measurement value by a square of a distance quotient, wherein the distance quotient is a quotient of the determined distance between the optical detector and the electrical discharge, and a calibrated distance between the optical detector and a source of electrical discharge to which the optical detector was calibrated.

The method may comprise calibrating the optical detector device by:
setting the gain of the optical detector to a maximum; and
calibrating the detector parameter against varying input optical radiation from a calibration electrical discharge source, wherein the step of calibrating comprises determining the calibration data by determining and storing calibrated quantitative measurement values associated with magnitudes of varying input electrical discharge associated with the calibration source of electrical discharge, and determining and storing associated detector parameters for each determined and stored calibrated quantitative measurement value.

The calibration data may comprise a calibration curve or look-up table of calibrated quantitative measurement values versus detector parameters, the method therefore comprising using the corrected detector parameter as an input to the calibration curve or look-up table thereby to determine a corresponding calibrated quantitative measurement value.

According to a fifth aspect of the invention, there is provided a system for measuring an electrical discharge having a discharge magnitude, wherein the electrical discharge causes a corresponding emission of optical radiation, the system comprising:

- optical detector to receive and process the optical radiation from the optical receiver arrangement to generate a detector output;
- a memory device storing pre-determined calibration data comprising calibrated quantitative measurement values associated with magnitudes of electrical discharge and detector parameters corresponding thereto, the detector parameters being operating parameters associated with the optical detector; and
- quantitative measurement module configured to receive and process a particular detector parameter with the stored calibration data thereby to determine a quantitative measurement associated with the magnitude of the detected electrical discharge.

The detector parameter may be an electrical parameter associated with the operation of the optical detector, wherein the detector output is or is related to a number of photons output by the optical detector, and wherein the calibrated quantitative measurement values comprise one of temperature and irradiance values associated with electrical discharges.

The optical detector may comprise a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output.

The system may comprise a current determining module configured to determine the electrical parameter, wherein the electrical parameter is the current drawn by the anode and/or photocathode of the optical detector in providing the detector output, in use.

The quantitative measurement module may be configured to:

- use the determined electrical parameter as an input to the calibration data to determine the associated calibrated quantitative measurement value related to the input optical radiation received by the optical detector by matching the determined electrical parameter to one stored in the calibration data and retrieving the calibration quantitative measurement value associated therewith;
- determine or measure a distance to the electrical discharge or source thereof from the optical detector; and
- determine the quantitative measurement associated with the magnitude of the electrical discharge by multiplying the retrieved calibrated quantitative measurement value by a square of a distance quotient, wherein the distance quotient is a quotient of the determined distance between the optical detector and the electrical discharge, and a calibrated distance between the optical detector and a source of electrical discharge to which the optical detector was calibrated.

The system may comprise a calibration module configured to:

- set the gain of the optical detector to a maximum; and
- calibrate the detector parameter against varying input optical radiation from a calibration electrical discharge source, wherein the calibration module is configured to determine the calibration data by determining and storing, in the memory device, calibrated quantitative measurement values associated with magnitudes of varying input electrical discharge associated with the calibration source of electrical discharge, and determining and storing, in the memory device, associated detector parameters for each determined and stored calibrated quantitative measurement value.

According to a sixth aspect of the invention, there is provided a method of operating an optical detector, the method comprising calibrating the optical detector to determine calibration data, wherein the calibration data is indicative of the gain required to keep an detector output of the optical detector device constant for varying input optical radiance.

According to a seventh aspect of the invention, there is provided a method for operating an optical detector device, the method comprising, in response to receiving input optical radiation, maintaining an detector output of the optical detector device at constant level by varying a gain of the optical detection device; and using the resultant gain to determine an amount of input optical radiation received by the optical detector device.

DESCRIPTION OF PREFERRED EMBODIMENTS

In the following description, for purposes of explanation, numerous specific details are set forth in order to provide a thorough understanding of an embodiment of the present disclosure. It will be evident, however, to one skilled in the art that the present disclosure may be practiced without these specific details.

Figure 1:
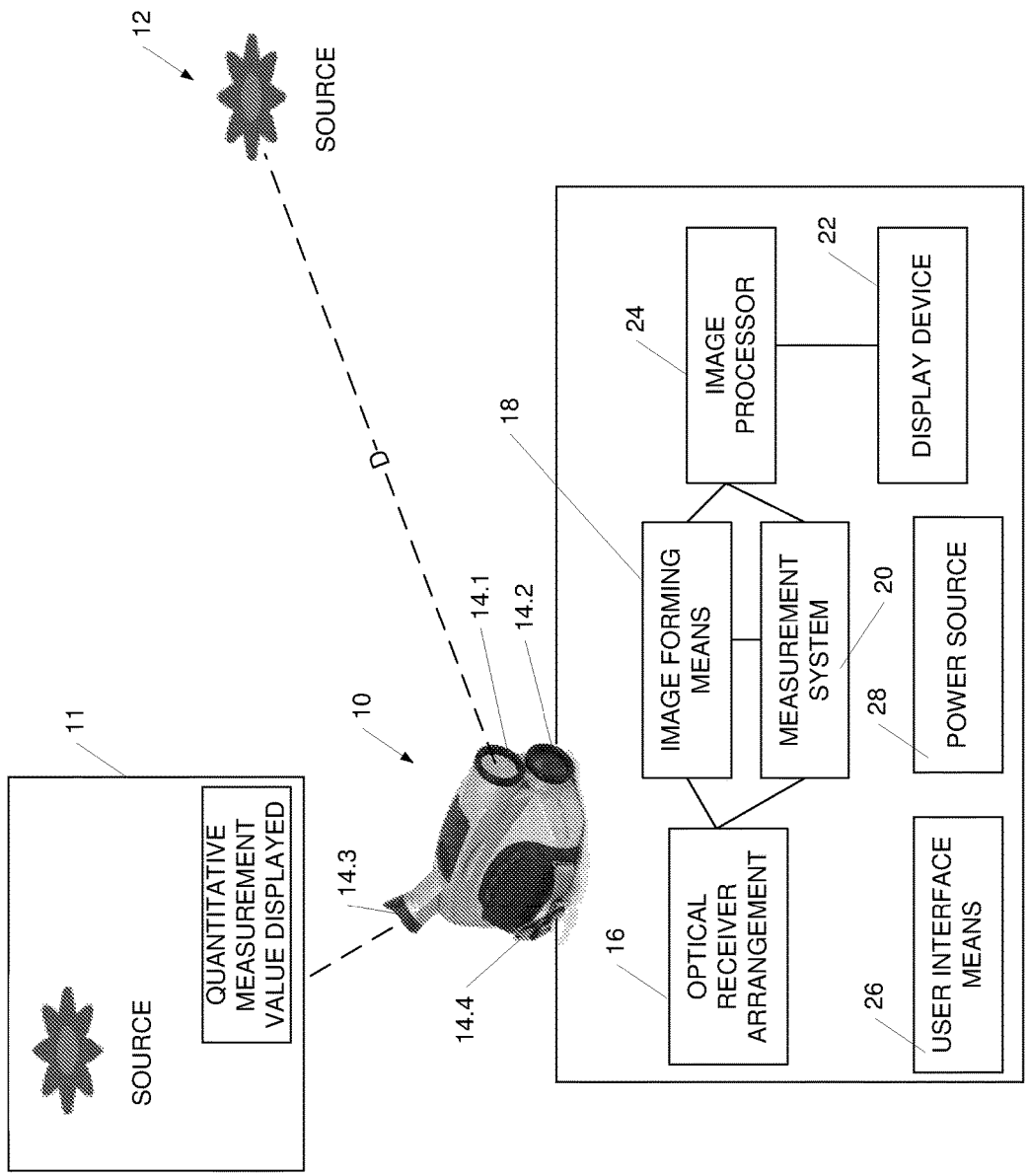
FIG. 1 shows a schematic illustration of an apparatus in accordance with an example embodiment of the invention.
Figure 2:
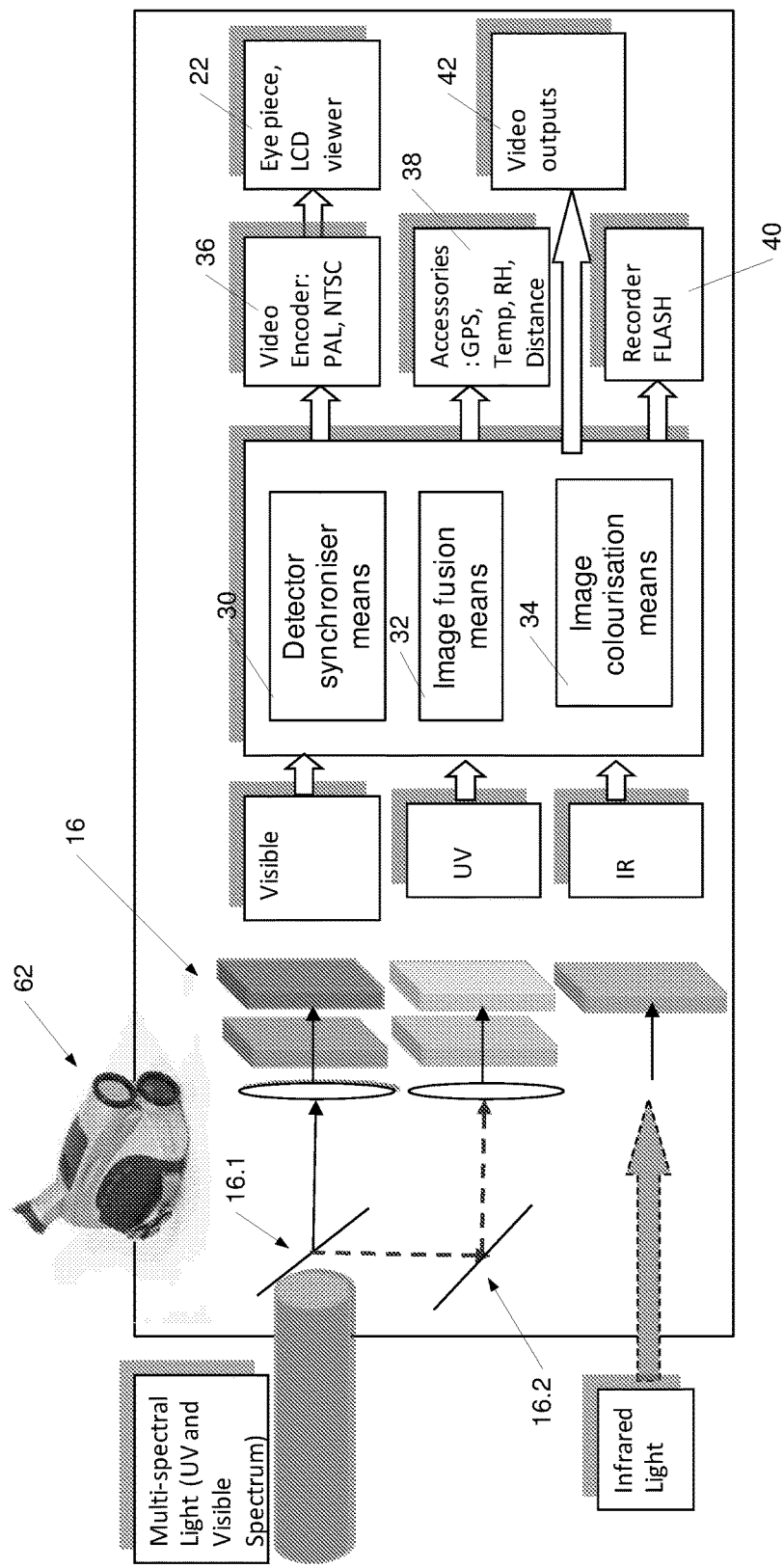
FIG. 2 shows another schematic illustration of an apparatus in accordance with an example embodiment of the invention.

Referring to FIGS. 1 and 2 of the drawings where an apparatus 10 in accordance with an example embodiment of the invention is illustrated. The apparatus 10 is typically a camera apparatus, similar to a conventional video camera, for use in real-time detection of electrical discharge from a source 12 which may be associated with a piece of high voltage electrical equipment, for example, an insulator on a high voltage power transmission line. The electrical discharge, or corona discharge, has a discharge magnitude and is responsible for causing a corresponding emission of optical radiation in the ultraviolet spectrum wherein emitted photons have a wavelength of between 240 and 400 nm.

The camera 10 is operable to generate and display a video image 11 of a scene being viewed and further configured to measure and overlay a quantitative measurement value of electrical magnitude associated with an electrical discharge in the scene being viewed, if any, accordingly in real-time. The camera 10 could be used handheld, or mounted at fixed position or from a helicopter platform (meaning used by helicopter crew flying along power line and inspecting the line hardware).

It will be appreciated that the insulator may or may not have a problematic electrical discharge, for example, corona discharge associated therewith. However, the camera apparatus 10 is operable to enable non-contact site inspection of the insulator substantially at a remote distance D from the potential electrical discharge. In this way, the apparatus 10 enables a user to detect or determine occurrence of corona discharge at a scene or site viewed by way of the camera apparatus 10. In addition, the camera apparatus 10 enables the user to determine the magnitude of the corona discharge at the remote distance D which in effect enables any power loss at the insulator to be determined without potentially hazardous physical inspection of the same.

To this end, the camera 10 comprises a portable housing 14 defining least one, particularly two, optical apertures 14.1 and 14.2 such that optical radiation emanating from outside the portable housing 14 enters the housing 14. The housing 14 also comprises an eye piece 14.3 for use by a user as will be described below. The eye piece 14.3 may be displaceable relative to the housing in a pivot-fashion similar to conventional eye pieces associated with conventional video cameras or camcorders. The portable housing 14 also comprises a handle 14.4 to facilitate portable handling of the camera apparatus 10.

The portable housing 14 houses all the electronics, three optical channels and data processing equipment associated with the camera apparatus 10. Save for the apertures 14.1 and 14.2, the portable housing 14 is therefore shielded from undesired ambient light or optical radiation or shielding the sensors from electrical magnetic interference.

The aperture 14.1 is conveniently in optical alignment with an optical receiver arrangement 16 operable to receive optical radiation from a scene. Optical radiation from a scene comprises at least ultraviolet, infrared, and human visible light. The optical radiation of interest received via the aperture 14.1 is typically multi-spectral light in the ultraviolet and visible light spectrum. However, it will be noted that the apparatus 10 is operable to process infrared light received via the aperture 14.2 as illustrated in FIG. 2. The embodiment contains a long wavelength sensitive infrared sensor that converts the optical radiation to an electrical signal which after processing indicates the temperature of the object. Hence the camera 10 embodiment is able to measure simultaneously the heat and discharge of an electrical object.

In any event, the optical receiver arrangement 16 may comprise one or more light-collectors or lenses and a beam splitter 16.1 and beam reflector 16.2 respectively as illustrated in FIG. 2. The optical receiver 16 may comprise one or more filters acting a band pass filter, blocking long wavelengths photons and passing through corona photons. The lenses could be either of refractive or reflective nature. In other example embodiments, not illustrated, it will be noted that instead of beam splitters 16.1 and 16.2, the camera apparatus 10 may comprise two apertures to the same end. It will be noted that there is one beam splitter 16.2 splitting off the ultraviolet rays of the incoming rays and thereafter one or two beam mirrors till the rays passing through arrangement 16. In a preferred example embodiment, there is one beam splitter 16.1, splitting off the ultraviolet rays of the incoming rays and thereafter one or two beam mirrors 16.2 till the rays pass through filters 16.

The cameral apparatus 10 comprises an image forming means 18 configured to form an image of the visible, the ultraviolet and the infrared optical radiation, received by the optical receiver arrangement 16. The image forming means may comprise a charge coupled device (CCD), a complementary metal oxide semiconductor (CMOS) device, or the like.

The camera apparatus 10 further comprises a measurement system or arrangement 20 configured to determine, from the received optical radiation, a quantitative measurement (value) associated with the discharge magnitude of the electrical discharge. The measurement system 20 will be discussed in detail below.

The apparatus 10 further comprises a display device 22 for displaying images formed by the image forming means 18. The display device 22 may be a liquid crystal display device (LCD), light emitting diode (LED) display device, or the like. The display device 22 typically enables the user to view scene at which the camera apparatus 10 is operatively direct at, in use. The display device 22 may be located within the housing 14 and may be viewed by a user via the eyepiece 14.3. However, this need not be the case as display device 22 may be provided as displaceable flap in a similar manner to viewfinders on conventional camcorders.

The apparatus 10 also comprises an image processor 24 configured to overlay information indicative of the determined quantitative measurement/value onto the image displayed by the display device 22. In this way, the quantitative value of a potential corona discharge being viewed via the camera apparatus 10 may be determined by the user. For example, a user may then determine whether the corona discharge is dangerous or not.

The image processor 24 may comprise one or more microprocessors, controllers, or any other suitable computing device, resource, hardware (electronics), software, or embedded logic to operate as described herein.

The camera apparatus 10 further comprises a user interface means 26 for receiving inputs from a user to direct operation of various functions of the camera apparatus 10. The user interface means 26 may comprise a plurality of buttons, a display, and the like to provide a user with user selectable operating parameters associated with the apparatus 10 and consequently receive the user selections for operation of the camera apparatus 10.

The camera apparatus 10 also comprises a power source 28 in the form of a conventional re-chargeable battery pack, or the like to power the electronics within the camera apparatus 10. For example, the power source 28 may comprise a Lithium-ion battery. Instead, or in addition, the power source 28 may comprise a mains power supply.

Though not illustrated, it will be appreciated that the camera apparatus 10 may comprise a plurality of electronic components and circuits to operate as described herein. However, in FIG. 2, there are further features of the camera apparatus 10 illustrated. In particular, the camera apparatus 10 comprises a detector synchroniser means 30 to synchronise the different detectors to each other and to the ultraviolet measurement system, or components thereof, to provide quantitative measurements.

The apparatus 10 also comprises an image fusion means 32 and an image colourisation means 34. For completeness, it will be noted that the means 32 and/or 34 is configured to overlay artificial colour onto the visible image generated thereby to provide additional information on temperature and corona power in one single image. The means 34 is optional in a preferred example embodiment.

The means 30, 32 and 34 may be stand-alone electronic circuits controllable, for example, by the image processor 24. Instead, or in addition they may each be an identifiable portion of code, computational or executable instructions, data, or computational object, to achieve a particular function, operation, processing, or procedure. In addition, they may each be implemented in software, hardware, or a combination of software and hardware.

The image processor 24 may comprise a video encoder module 36 to encode the processed imaged to PAL (Phase Alternating Line), NTSC (National Television System Committee) formats/systems.

The camera apparatus 10 may also comprise a plurality of other conventional electronic components 38 which are configured to provide data for selection by a user via the user interface means 26 and processed and displayed via the display device 22. For example, a GPS (Global Positioning System) unit, a temperature sensor, a clock, an ambient pressure sensor, a relative humidity sensor and input means for distance to a potential corona source 12.

The camera apparatus 10 has also a number of inputs and outputs ports to collect and to provide data to the user.

The camera apparatus 10 may comprise a flash memory device 40 for facilitating storage of images processed. It will be noted that video images of a scene recorded by the camera apparatus 10 may be stored via the device 40. This may be achieved in a similar manner as a conventional camcorder.

Instead, or in addition, to the display device 22, the camera apparatus 10 comprises a video output means 42 for facilitating output of processed images to an external display, or for transmission of processed or recorded video images to a remote location.

It will be appreciated that processor 24 is configured to process received UV images by integrating the same in time and then thresholding the same to remove noise photons and increase gain. The module 24 simply overlays the processed data on the visible image to form blobs on the image where the corona discharge occurs. In some example embodiments, the overlay will be in appropriate colours based on the new quantitative corona intensity calculations described below. The IR image is simply overlaid.

Figure 3:
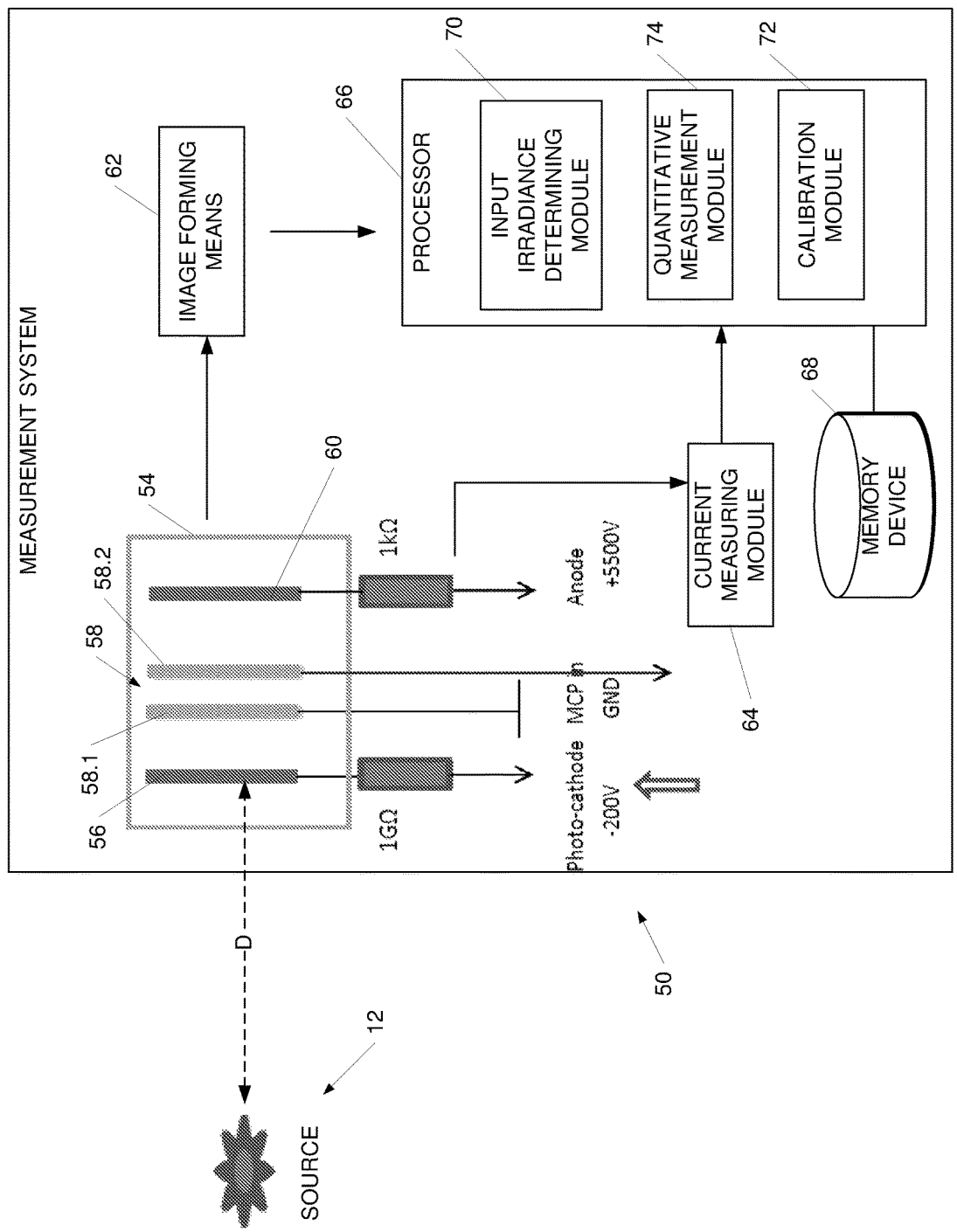
FIG. 3 shows a schematic block diagram of a system in accordance with an example embodiment of the invention.
Figure 4:
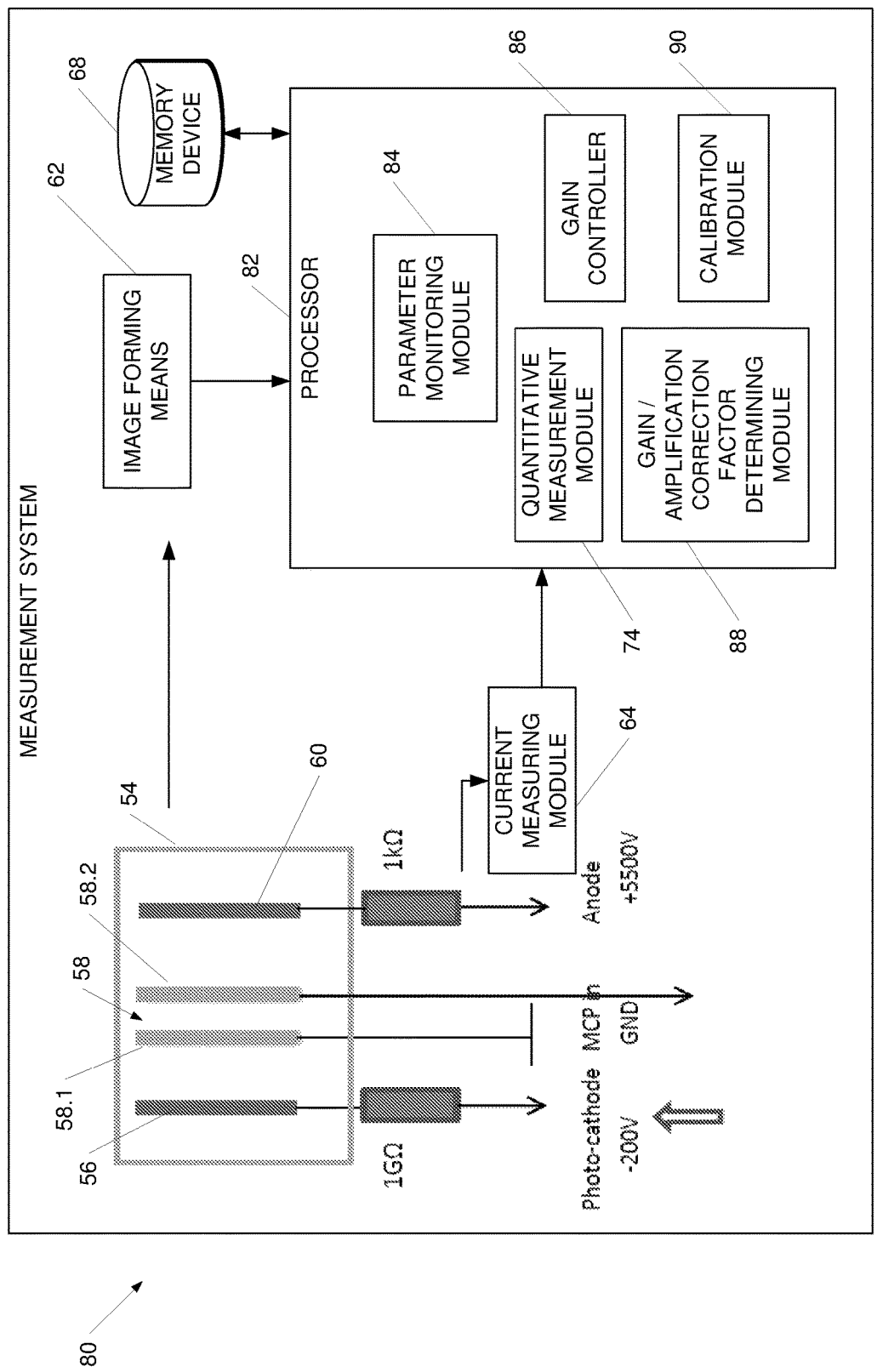
FIG. 4 shows a schematic block diagram of another system in accordance with an example embodiment of the invention.

Referring to FIGS. 3 and 4 of the drawings a measurement system in accordance with an example embodiment of the invention is generally indicated by reference numeral 50 and 80 respectively. Though the measurement system 20 described above may be selected from one or both of systems 50 and 80, in some example embodiments, the system 50, 80 or components thereof may be separate independent measurement systems spread geographically. For example, the systems 50, 80 may be stand alone, for example, off-line systems, for example, equipment failure monitoring systems configured to generate suitable alarms in response to undesired operating parameters measured or determined thereby.

In some example embodiments (not discussed further), the user may select, via the user interface means 26, which system 50, 80 which they desire the camera apparatus 10 to employ, in use, to determine the quantitative measurement of corona discharge. Though in some example embodiments both systems 50 and 80 are provided in the camera apparatus 10, they are discussed separately for ease of explanation.

Referring first to the system 50, it will be noted that the system 50 comprises an optical detector device, electron amplifier detector device or image intensifier 54 comprising a photocathode 56, a multiplier means 58 in the form of a micro channel plate (MCP), and an anode 60 wherein the MCP 58 is disposed operatively between the photocathode 56 and the anode 60.

It will be understood that the photocathode 56 is configured to convert photons, associated with input optical radiation from the electrical discharge, incident thereon to photo-electrons.

The photocathode 56 is typically an input window to the system 50 and is configured to be exposed to the source 12 to receive optical radiation or ultraviolet light/radiation associated with the electrical discharge. In some example embodiments, a light collecting or concentrating means comprising a lens and a filter may be provided adjacent the photocathode 56 for collecting light from the electrical discharge, for example, in the ultraviolet spectrum.

The photocathode 56 is constructed from a material configured to convert photons from received optical radiation to electrons, for example, bialkalai materials which are selected to match the energy level of the photons in the ultraviolet spectrum associated with the optical radiation. In a preferred example embodiment, the photocathode 56 is constructed from a circular disk of caesium telluride (Cs—Te) as the caesium telluride atom electron band gap is matched to the energy level of a photon in the ultraviolet spectrum (e.g., 200 to 280 nm). In this way, the photocathode 56 converts, in a discriminatory manner, photons to photo-electrons, or generates electrical signals, only in response to receiving photons in the desired ultraviolet spectrum range associated with optical radiation from a corona discharge. Also, it will be appreciated that the conversion factor of the focal plane of the device 54 is fixed as it determined by the quantum efficiency factor of the photocathode material (Cs—Te). The photocathode current is linearly proportional to the number of photons per second converted to photo-electrons.

It will be understood that the current of the photocathode, Ip, is directly related to the amount of photons incident thereon. The photocathode current Ip may therefore be determined by using a voltage, Vr, across a 1 GΩ resistor associated with the photocathode 56 and the equation Ip=Vr/R.

The MCP 58 operatively coupled to the photocathode 56 effectively serves as a photo-electron multiplier to multiply the photo-electrons from the photocathode 56 by a particular gain value or factor G, hereinafter referred to as gain G for brevity. In an example embodiment, the MCP 58 comprises a double stage plate 58 and may provide a variable gain G of up to $2 \times 10^6$. In the case of the double stage plate 58, the input plate entices electrons from the photocathode 56 as it operates at ground potential, and the output plate is operated at a higher potential such as +1500 V such that electrons passing through the same are multiplied by the gain G as mentioned previously. In other words, the plate 58 operatively amplifies the electrical signal/s received from the photocathode 56.

The anode 60 is operatively coupled to the MCP 58 and is configured to convert the amplified electrons to output photons. The anode 60 entices electrons from the MCP 58 as it has a relatively high potential of about +5000V to +7000V, preferably +5500 Volts. The anode 60 comprises a phosphor screen to convert the electrons or secondary emitted electrons to photons. The current drawn by the anode 60 is determined by the number of electrons received thereby.

The anode 60 may have an anode current, Ia, which is determined by multiplying the photocathode current Ip by the gain G of the plate 58 as given by the following equation:

$$Ia = G \cdot Ip$$

It will be noted that the anode current Ia is directly proportional to the photocathode current Ip and because of the gain G, is much easier to measure, in use At least the abovementioned components of the device 54 may be housed in a cylindrical sealed housing or vacuum tube. The photocathode 56, the plate 58 and the anode 60 may be planar circular disks spaced at a predetermined distance from each other in the housing with operative major faces parallel to each other.

Though not illustrated, it will be appreciated that the system 50 may comprise a power source, for example, a rechargeable battery pack, or the like, to power the same including powering the optical detector device 54. In addition, for ease of illustration, electronic circuitry (e.g., driver circuitry, peripheral circuitry and components), etc. associated with the system 50 is not shown. In one example embodiment, the system 50 is typically powered by way of the power source 28 from the camera 10. The embodiment 50 compose switch mode power and voltage doublers circuitry to generate high voltage to drive/power up the individual components 56, 58 and 60, differential amplifiers to measure the individual electrical parameters of the embodied components (56, 58 and 60).

The system 50 also optionally comprises an image forming means 62 comprising a CMOS device or CCD configured to convert received photons to electrical signals. The CMOS means 62 is operatively connected to the anode 60 by means of an optic fibre to facilitate forming an image of the photons generated by the anode 60, in a conventional manner. These photons may typically be indicated as distinct white dots or blobs in the image formed. It follows that a corona discharge would appear as dots or integrated into one large dot in the image. The corona dot(s) are overlaid—referenced—by image forming means 18 onto the visible image and represents geometrically the exact location of the corona on the high voltage equipment. The colour of the corona dots can be selected of any colour. The image formatting means 18 comprise an electronic circuitry and software to remove photon noise by differentiating between random noise and corona signal and increase the gain by integrating over time the corona photons. The image processor 24 may be configured to overlay images formed by the means 62 onto conventional video images formed by the image forming means 18. In this way a user is presented with an image of a scene with a blob/s corresponding to a potential electrical discharge/s associated with devices under test (DUT) in the scene in addition to the quantitative measurement associated therewith.

In any event, the system 50 comprises a current measuring module 64 configured to measure the current of at least the anode 60. This may be done in a conventional manner using Ohm's law, particularly the voltage across, for example, a 1 kΩ resistor associated with the anode 60. To this end, the module 64 may be electrically coupled to the anode 60, for example, via a hardwired connection.

It will be noted that in some example embodiments, not illustrated or described, the module 64 may operatively be connected to the photocathode 56 to determine the photocathode current Ip. However, this may be more difficult to do than measuring the anode current Ia as the photocathode current Ip is relatively small in comparison to the anode current Ia.

The system 50 also conveniently comprises a processor or processor arrangement 66. The processor 66 may comprise, or may be communicatively coupled to, a memory device 68 storing therein or thereon data and a set of non-transitory computer readable instructions for controlling or directing operation of the processor 66 and hence the system 50. The memory device 68 may comprise volatile or non-volatile memory. It is to be understood that the processor 66 may comprise one or more microprocessors, controllers, or any other suitable computing device, resource, hardware, software, or embedded logic. In addition, all the processors described herein may form part of the processor 24 of the camera apparatus 10. However, the processors will be discussed as separate processors for ease of explanation.

The processor 66 may comprise a plurality of components or modules which correspond to the functional tasks to be performed by the processor 66 and thus the system 50. In this regard, "module" in the context of the specification will be understood to include an identifiable portion of code, computational or executable instructions, data, or computational object, for example, stored in the device 68, to achieve a particular function, operation, processing, or procedure. It follows that a module need not be implemented in software; a module may be implemented in software, hardware, or a combination of software and hardware. Further, the modules need not necessarily be consolidated into one device but may be spread across a plurality of devices.

The processor 66 comprises an irradiance determining module 70 configured to use the anode current Ia determined by the current measurement module 64 together with predetermined calibration data stored in the memory device 68 to determine an amount of input optical radiation received by the optical detector device 54. The calibration data may be stored in the memory device 68 and may comprise information indicative of input optical radiation and corresponding anode current electrical values associated therewith. In particular, the calibration data may comprise a predetermined calibration curve or function of anode current Ia and input optical radiation received by the optical detector device 54 such that the module 70 is configured to determine the input optical radiation or irradiance to the device 54 based on or, in particular, by using the anode current Ia. In this example embodiment, the calibration curve effectively provides the relationship between anode current Ia and the input optical radiation.

It will be noted that in some example embodiments, the calibration data may be in the form of a look-up table using anode current Ia as an input to determine corresponding input irradiance.

Though reference in the specification will be made to the use of anode current Ia, corrected gain G, etc. it will be understood by those skilled in the field of invention that where applicable, reference is made to information indicative of these values for purposes of processing by the processor 66 in a conventional fashion.

The memory device 68 may be provided with the calibration data pre-loaded thereon. However, in some example embodiments, for example, the example embodiment illustrated, the processor 66 comprises a calibration module 72 configured to generate the calibration data by calibrating the output of the detector device 54, for example, the anode current Ia against the input irradiance. For example, the module 72 may be operable, during calibration, in response to a calibration source being brought into operative proximity to the device 54, to record anode current Ia in response to varying irradiance of the source incident on the device 54 and plot the anode current Ia against the input irradiance on the calibration curve. Each device 54 may be calibrated to determine calibration data in the manner described herein.

It will be appreciated that the determined calibration curve may be used to determine the calibration function which is configured to receive anode current Ia as an input and return the input irradiance as an output thereto, or Ia=f (Irradiance). Input irradiance is determined in watts/cm$^2$ or watts/m$^2$ or photons/sec, etc.

By the phrase "irradiance incident on the device 54" or "input irradiance", is meant the irradiance operatively received by the photocathode 56 of the device 54 or in other words radiance—radiant flux—of the source of the corona discharge. In this regard, it is desirable to determine information indicative of the actual power loss at the corona source 12 as this information will facilitate ease of diagnosis of a fault, or the extent of a fault, etc.

To this end, the processor 66 also comprises a quantitative measurement module 74 configured to determine a quantitative measurement associated with the magnitude of the electrical discharge of the source 12 by using the input irradiance determined by the module 70. In particular, the module 70 effectively determines or estimates the amount power loss (radiant) at the source 12 by multiplying the determined irradiance received by the device 54 by a one over square of a distance quotient of a measured distance D between the source 12 and the optical detector device 54 and the calibrated distance between a calibration source and the optical device 54. The calibration distance is the distance between a calibration source of corona discharge and device 54 during calibration of the device 54 to obtain the calibration data. The system 50 may receive, as an input via the user interface means 26, the distance between the suspected source of the electrical discharge 12 and the device 54. Instead, or in addition, the system 50 may be configured to prompt a user, via the user interface means 26, to locate the device 54 substantially at a prescribed distance from the corona source 12. Instead, or in addition, the system 50 may receive, as an input via a rangefinder means or distance determining means 58, the distance between the suspected source of the electrical discharge 12 and the device 54. The distance determining means 58 may be a laser distance determining means 58.

The quantitative measurement module 74 is also configured to conveniently to apply an atmospheric or environmental correction factor such as relative humidity and temperature to the determined quantitative measurement to provide more accurate results. The correction factor may be one of many factors dependent on weather conditions stored in the memory device 68. A correction factor may be user selectable, via the user interface means 26, depending on the prevailing weather conditions at the time of operation or use of the system 50 or in some example embodiments may be selectable by the system 50.

The functionality as herein described conveniently allows the system 50 to determine the magnitude of corona discharge at a particular site. However, it will be noted that there are a few problems associated with the device 54 which could potentially affect determining measuring corona discharge. For example, individual MCP channels have different gains G which cause photons displayed by the CMOS means 62 to be of different sizes albeit having the same energies. In this regard, gain calibration for each tube comprising an average calibration over all channels is of little to no use when dealing with individual photons. It will be noted that photons are discussed because the input to the device 54 comprises at least photons from the corona discharge.

In another problematic scenario, it will be noted that with high gains or input irradiance, the power source to the device 54 cannot supply enough current to feed the anode 60. This consequently results in a drop in gain G (fewer anode electrons/second) of the device 54. Also, the size of corona discharge zones in images formed by the means 62 oscillate between small and large irrespective of the magnitude of the corona source, possibly because of the inability of the power supply to source sufficient current for forming accurate corona discharge zones in the images.

In addition, it will be noted that the gain G of the device 54 changes with input irradiance, possibly because of the non-constant electric fields in the plates 58 and/or space charge build up at high current levels.

In another scenario, a threshold is required to be placed on the image associated with the means 62 before photons could be counted on said image. This is further complicated by very low intensity photons at low gains resulting in almost non-visible zones in the images, or relatively high intensity "halos" at high gains. It will be noted that automatic thresh-holding techniques have been tried with limited success.

Figure 6:
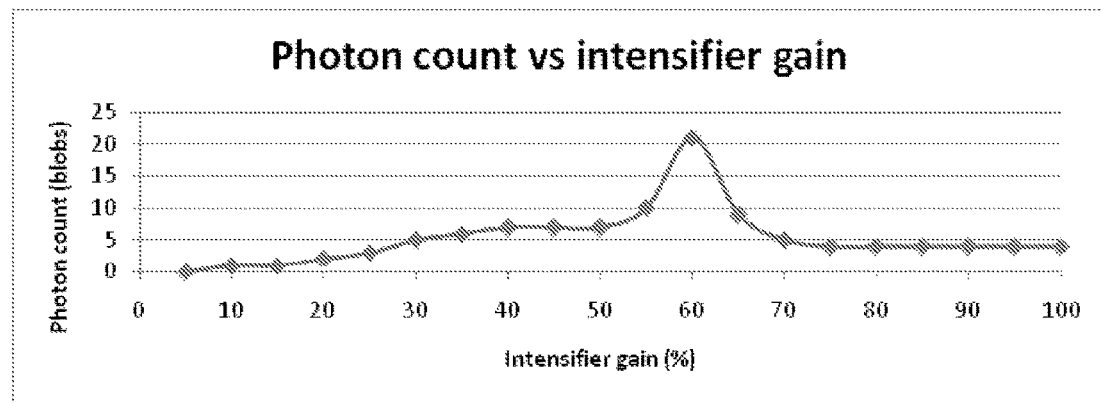
FIG. 6 shows a graph of photon count versus the gain of the optical detector device in accordance with an example embodiment of the invention.

In one other problematic scenario, at higher source powers of corona discharge and intensifier gains, it becomes difficult to separate and count individual photons. In FIG. 6, it will be noted from the illustrated graph that photon count increases with gain G until at roughly 60% gain G where after photons then start fusing into one big blob which cannot be separated and counted resulting in the count beginning to drop.

The user may address these abovementioned problems by selecting use of system 80.

Looking also at FIG. 4 of the drawings, it will be noted that some components of the system 80 are similar to the system 50 and the same reference numerals will therefore be used to refer to similar components. However, it will be noted that in some aspects, the like components may differ in functionality as will be discussed below. It will be appreciated that the system 80 as described herein seeks at least to address the problems as hereinbefore mentioned.

One important difference between the system 50 and the system 80 is that the processor or processor arrangement 82 of the system 80 differs in some aspects from the processor 66. In particular, the processor 82 comprises a parameter monitoring module 84 configured to receive information indicative of at least one detector output associated with the optical detector device 54 to determine variations of the detector output relative to an associated predetermined calibration parameter or set point in response to exposure of the optical detector device 54 to the emission of optical radiation.

To this end, the module 84 is configured to compare the received detector output with the corresponding calibration set point. The module 84 may receive information indicative of, and hence effectively monitor, one or more output parameters associated with the detector 54 or detector outputs.

The detector outputs monitored, by the module 84 may include one or more of anode current Ia, photon count in the image produced by the image forming means 62, total photon area in the image produced by the means 62, and one or more MCP 58 events. In an example embodiment, the term "set point" refers to the fixed state of the device 54 with respect to the detector outputs mentioned. For each detector output, there may be at least one calibration set point around which the device 54 is calibrated to determine calibration data as will be discussed below.

In some example embodiments, there may be more than one set point associated with the output parameter. In this example embodiment, the calibration set points (from the range of set points) may be presented to and selected by a user via the user interface means 26, in use, depending on considerations during operation of the system 80. The user may also optionally select the detector outputs monitored or received by the module 84 also depending on considerations during operation of the system 80. However, in a preferred example embodiment, receipt or monitoring of the various detector outputs may be done automatically. In the case of the latter, the system 80 may generate and transmit suitable messages informing the user of the detector output being monitored.

The anode current Ia may be monitored in the case of "high" power corona, the total photon area (total number of pixels) will be monitored in the case of "medium" power corona, photon counts (number of blobs) or plate 58 event counts will be monitored for very "low" power corona.

In example embodiments involving the measuring of "high power" corona, the module 84 may be configured to monitor, or receive information indicative of, the anode current Ia and compare the same with the associated set point stored in the device 68. It will be noted that in some example embodiments, the calibration set points need not be single values but may comprise calibration bands which enable quantitative measurement of corona discharge in a manner as described herein, what is important is the relationship between the received detector output and the calibration parameters or set points optionally comprising calibration bands as the case may be. In a preferred example embodiment, the received detector output must be substantially equal to the calibration set point.

In any event, if the monitored anode current Ia is less than or equal to the corresponding calibration set point for the anode current Ia, the module 84 then monitors or receives information indicative of the total photon area. Similarly, if the monitored total photon area is less than or equal to the corresponding calibration set point for the total photon area, the module 84 then monitors the photon count or the micro-charge plate current events. It will be noted that the processor 82 may comprise one or more image processing modules configured to process the images from the means 62 to determine the detector outputs described with reference thereto.

Figure 7:
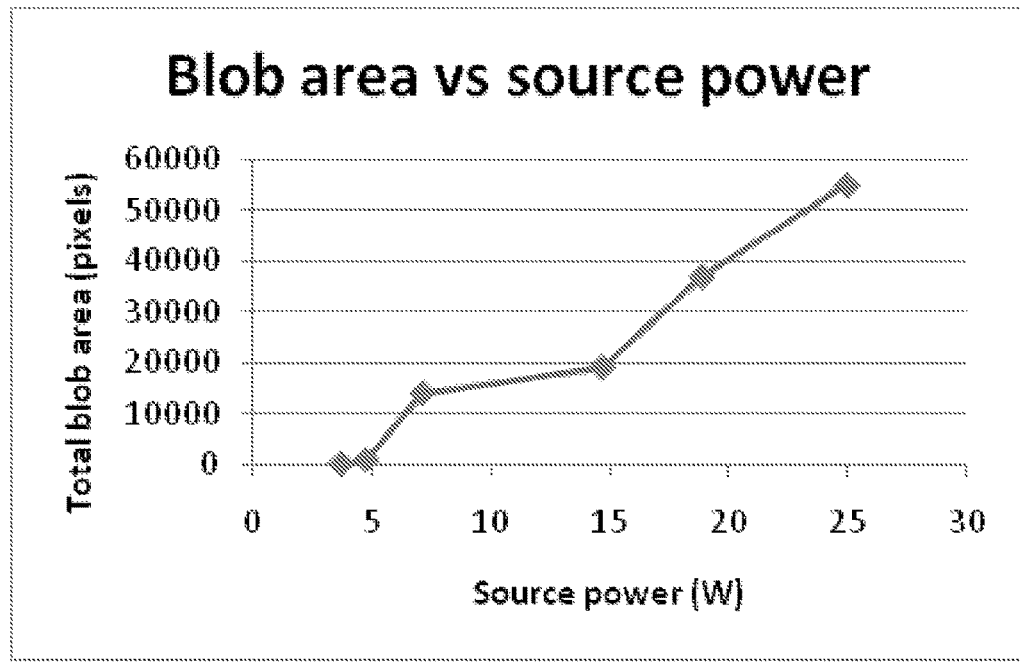
FIG. 7 shows a graph of photon blob area versus the power of the source of the optical detector device in accordance with an example embodiment of the invention.
Figure 8:
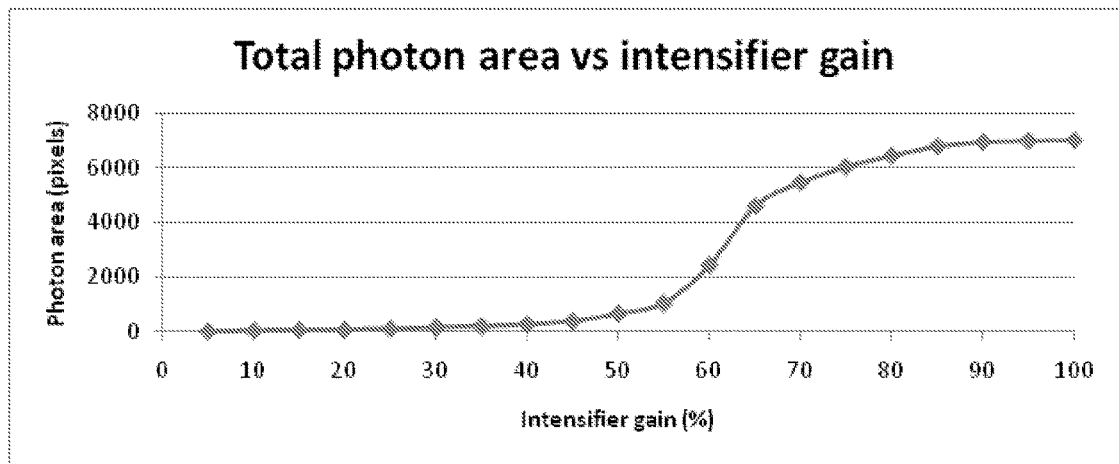
FIG. 8 shows a graph of total photon area versus the gain of the optical detector device in accordance with an example embodiment of the invention.

Regarding the total photon area in the image, it will be noted from FIG. 7 that the total area of blobs in the image produced by the means 62 is related to the input irradiance or source power in watts as illustrated. Similarly, there is a relationship between total photon area and gain G of the device 54 as illustrated in FIG. 8.

In any event, for all detector outputs mentioned, the gain G of the device 54 changes with varying input irradiance. In this regard, the processor 82 typically comprises a gain controller module 86 configured automatically to adjust the gain G of the optical detector device 54 to a corrected gain value, in response to the module 84 determining variation of the received detector output thereby to maintain a predetermined relation between the received detector output and the corresponding calibration set point. The predetermined relation may be that the detector output is substantially equal to the calibration set point. It will be noted that the corrected gain value is not a predetermined value but is the gain value at which or correction factor by which the gain G is corrected or adjusted to bring and/or keep the detector output substantially equal to the corresponding calibration set point.

The module 86 controls the gain of the device 54 by operating the microchannel plate voltage 58 to vary the gain applied thereby. Instead, or in addition, the module 86 controls the gain of the device 54 by varying the duty cycle of a gate pulse applied to the photocathode 56. In other words electronic shuttering of the device 54 takes place to control the number of photons processed by the device 54 to maintain the detector output or anode current substantially at the set point.

The gain G is usually initially set at a maximum value and when monitoring anode current Ia, if the same is greater than the corresponding calibration set point, the gain controller module 86 automatically decreases the gain G of the optical detector device 54 gradually to the corrected gain value until the monitored anode current Ia is equal to the corresponding calibration set point. As mentioned above, the corrected gain value is the gain G to which the device 54 is adjusted to bring the anode current Ia substantially equal to the corresponding calibration set point.

Similarly, when monitoring the total photon area the gain controller module 86 may be configured, if the total photon area is greater than the corresponding calibration set point, to gradually decrease the gain G of the optical detector device 54 to the corrected gain value wherein the monitored total photon area is equal to the corresponding calibration set point at the corrected gain value.

In addition, when monitoring the photon count or micro channel plate event count the gain controller module 86 may be configured, if the total count is greater than the corresponding calibration set point, to decrease the gain G of the optical detector device 54 to the corrected gain value wherein the monitored count is equal to the corresponding calibration set point.

The processor 82 also comprises a gain determining module 88 configured to determine the corrected gain value to which or correction factor by which the gain G of the device 54 is corrected or adjusted to keep the monitored detector output substantially equal to the calibration set point.

Though having some of the functionality of the similar module 74 of the system 50 of FIG. 3, it will be appreciated that the quantitative measurement module 74 of the processor 82 is configured to use the determined corrected gain value to determine a quantitative measurement associated with the magnitude of the electrical discharge. In particular, the module 74 is configured to use the determined corrected gain value together with pre-determined calibration data stored in the memory device 68 to determine an amount of input optical radiation, irradiance, or temperature associated therewith received by the optical detector device 54, wherein the calibration data in the system 80 comprises information indicative of input optical radiation and corresponding gain values of the optical detector device 54 (for a specific set point) associated therewith. It will be noted that this differs from the determination of the input irradiance as described above with reference to module 70 of the system 50 of FIG. 3.

The module 74 of the system 80 then determines the quantitative measurement of the electrical discharge of the source or corona discharge by using the determined input irradiance in a manner as hereinbefore described. However, this data may conveniently also be predetermined and stored in a corresponding look-up table for a plurality of different distances from the corona discharge. In this example embodiment, the user is prompted or may select the distance of the device 54 from the corona source. Instead or in addition the distance may be obtained automatically from the accessories 38.

It will be noted that the calibration data stored in the memory device 68 of the system 80 is different from the calibration data stored in the memory device 68 of system 50. In particular, the calibration data stored in the memory device 68 of the system 80 may comprise a calibration function for each calibrated set point associated with the detector outputs as hereinbefore described. The calibration function provides the gain G, or gain values, of the optical detector device 54 as a function of input irradiance for each calibration set point such that corrected gain value may be used as an input to the calibration function to determine corresponding input irradiance.

In a preferred example embodiment, the calibration data may comprise a calibration curve of input irradiance versus gain G, the module 74 may therefore use the determined corrected gain value as an input to the calibration curve thereby to determine a corresponding input irradiance corresponding to the same for a particular associated calibration set point. Calibration curves may be provided for each calibration set point associated with the detector outputs.

Figure 9:
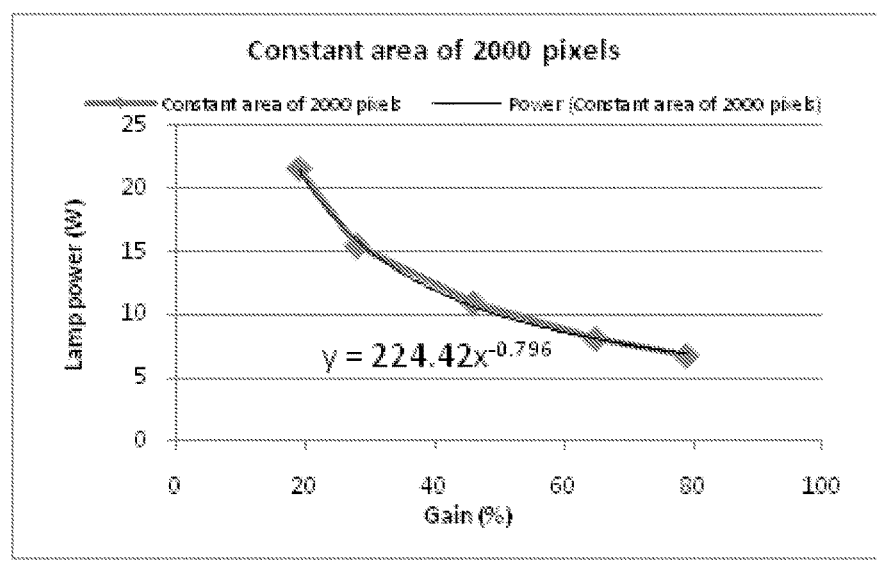
FIG. 9 shows an example calibration curve of input irradiance versus gain of the optical detector device in accordance with an example embodiment of the invention.

In a more practical example embodiment, the calibration data may comprise a look-up table of gains G with corresponding input irradiance values for a particular calibration set point such that the corrected gain value selected to maintain the predetermined relationship between the received detector output and the associated calibration set point for a particular input irradiance is used as an input to the look-up table associated with the calibration set point which would effectively output the corresponding irradiance value. It will be re-stated that each calibration set point may have specific calibration data, for example, a suitable look-up table associated therewith. For example, referring to FIG. 9, for a constant detector output of photon area, a calibration curve of input irradiance versus gain G is illustrated with a calibration set point of 2000 pixels.

Since all the detector outputs are related to the current through the device 54, it is desired that by keeping the current through the device 54 constant, the effects of non-constant electric fields, power supply saturation, etc., for example, the problems as previously mentioned will be addressed.

To obtain the calibration data, the system 80 comprises a calibration module 90 operable to determine calibration set points for each of the detector outputs monitored as well as calibration data associated therewith. The calibration module 90 may also be operable to calibrate the optical detector device 54 by calibrating the gain G of the same against varying input optical radiation thereby to keep at least one detector output of the optical detector device 54 substantially constant at least at one associated calibration set point. The module 90 may be operable to select the calibration set point for a particular detector output at 10% of the maximum value for the same. The gain G may be selected at predetermined increments and the input irradiance is varied, for example, by varying the calibration source of discharge, till the selected calibration set point is reached. In this way, the module 90 may record the gain G and particular input irradiance at which each calibration set point is reached for varying input irradiance. The module 90 may be operable in this fashion for each gain value and for calibration set points for each detector output of interest as hereinbefore described.

In the case where the measurement systems described herein are provided in the camera 10, each camera 10 is calibrated in a similar fashion to determine calibration data as described herein.

Figure 5:
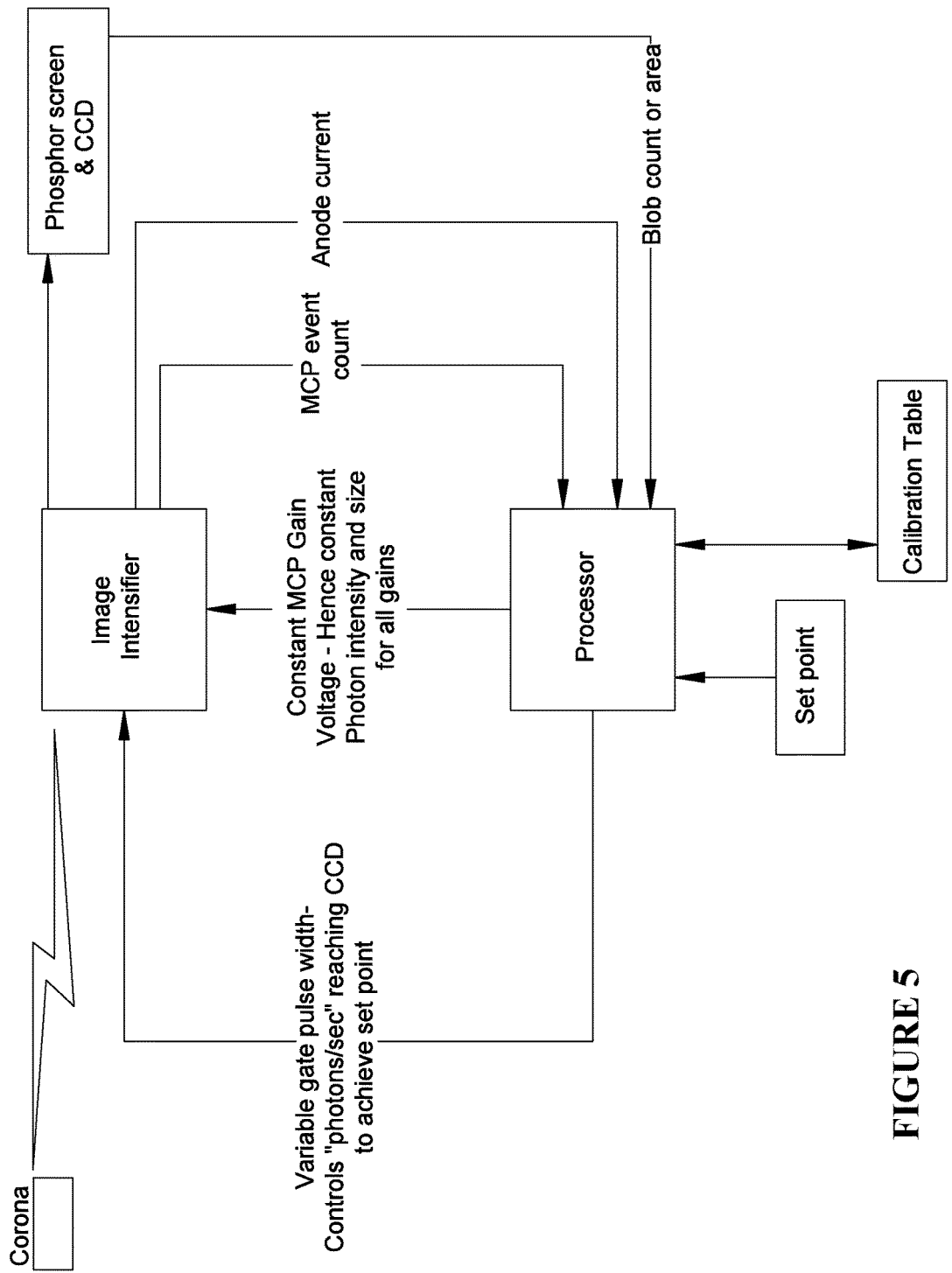
FIG. 5 shows a high level schematic block diagram of a system in accordance with an example embodiment of the invention.

In FIG. 5, another high level schematic drawing of a system in accordance with an example embodiment of the example embodiment is illustrated. The system illustrated in FIG. 5 is an example embodiment of a system in accordance with an example embodiment of the invention wherein the system comprises a processor to process inputs from a phosphor screen and/or CCD, and the image intensifier to control the image intensifier and determining the quantitative measurement of an electrical discharge in a manner described herein.

Example embodiments will now be further described in use with reference to FIGS. 10 to 15. The example methods shown in FIGS. 10 to 15 are described with reference to FIGS. 1 to 5, as applicable, although it is to be appreciated that the example methods may be applicable to other systems and apparatuses (not illustrated) as well.

Figure 10:
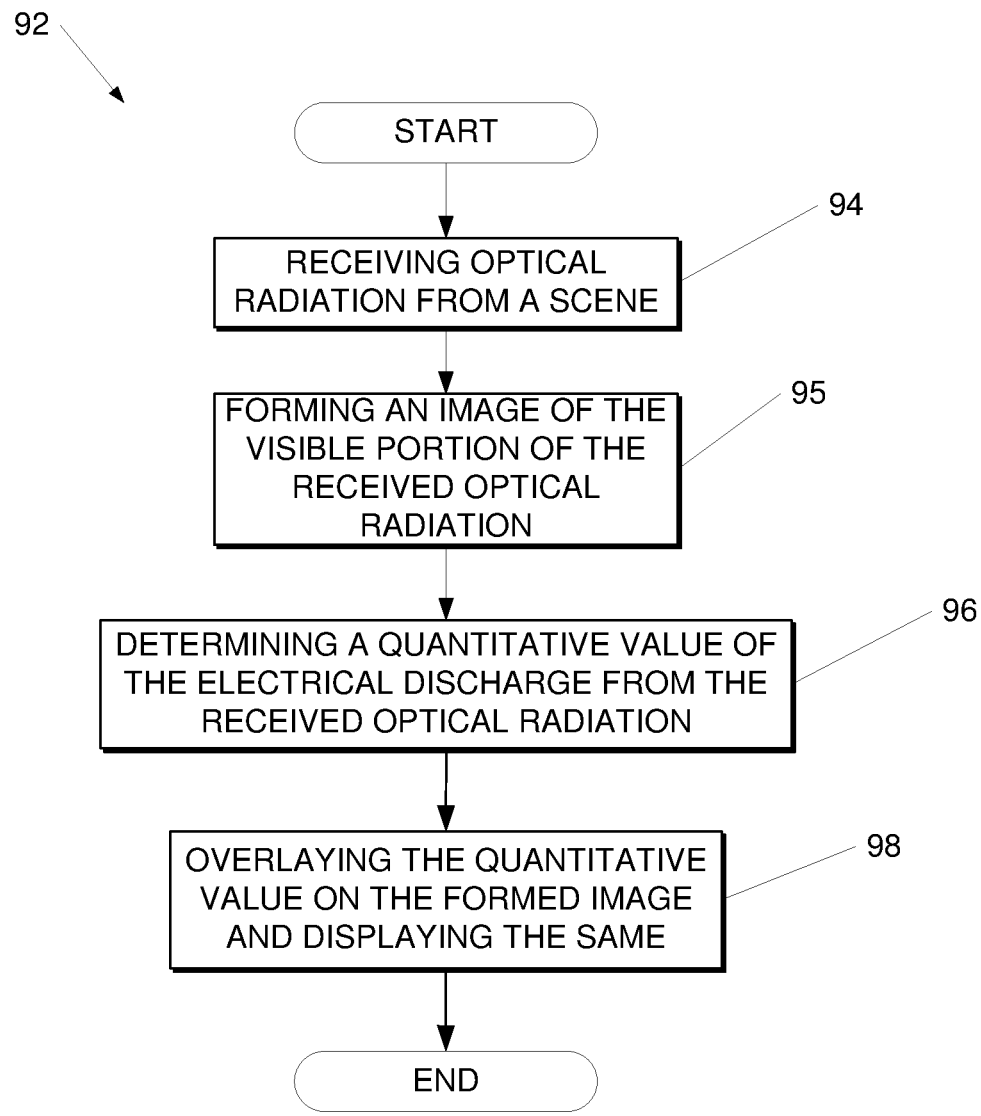
FIG. 10 shows a high level flow diagram of a method in accordance with an example embodiment of the invention.

Referring to FIG. 10 of the drawings, a high level flow diagram of a method 92 in accordance with an example embodiment is illustrated. The camera apparatus 10 is typically carried to a location where it is desired to detect corona discharge, for example, a location adjacent an electrical insulator. The camera apparatus 10 is then located substantially at a predetermined distance from the electrical insulator. The user selects options for measuring electrical discharge, for example, either the system 50 or 80, or selects parameters such as the calibration set points, etc. As described herein, the set points may be pre-determined and fixed for a detector output or anode current monitored.

The user then operates the camera apparatus 10 by aiming the camera apparatus 10 at the scene of the electrical insulator. This step is essentially to optically align at least the aperture 14.1 with the insulator.

The method 92 comprises receiving, at block 94 optical radiation from a scene viewed via the camera apparatus 10. The received optical radiation is directed via the aperture 14.1 to the optical receiver arrangement 16 where it is split via the beam splitter 16.1, and beam mirrors 16.2.

Light received via one of the beam splitter/mirrors 16.1, 16.2 is used in the forming, at block 95, an image of visible optical radiation received in a conventional manner by way of the image forming means 18.

Method 92 comprises determining, at block 96, a quantitative measurement value associated with the discharge magnitude, for example, via the system 20 (50, 80) as described herein. As mentioned, the received light of interest in this aspect is UV light.

The method 92 then comprises processing, at block 98, the images formed by the image forming means 18 in the step at block 95, by at least overlaying information indicative of the determined quantitative measurement value of the detected electrical discharge onto the formed images by the means 18 to generate processed images. The method 92 then comprises operating the display device 22 to display, substantially in real-time, the processed images. Images of the discharge, or photons associated therewith, formed by second image forming means 62 coupled to the anode of the optical detector is also combined with the images formed by the means 18. In this way the user views, the insulator, for example, via the eye piece 14.3 of the camera apparatus 10 and is presented with video images of the insulator substantially in real-time with the areas of the insulator where electrical discharge is present being superimposed with spots or the blobs and a quantitative value of the discharge being provided in the video images, for example, on the corner of the display. In this way the user is then able to detect, in a non-contact fashion corona discharge at the insulator as well as a potential degree of damage to the same in view of the determined quantitative value.

Figure 11:
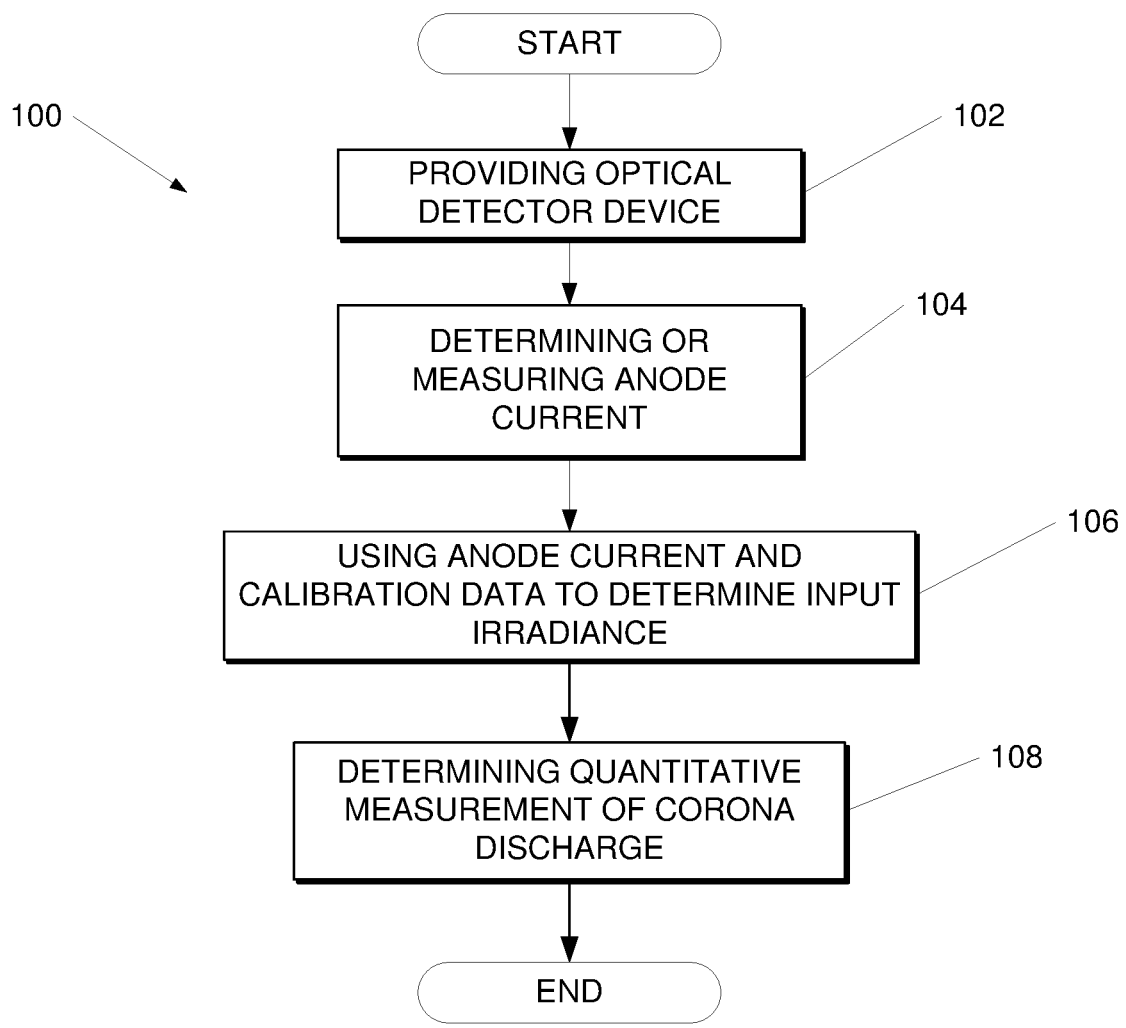
FIG. 11 shows another high level flow diagram of a method in accordance with an example embodiment of the invention.

Referring to FIG. 11, where a high level flow diagram of a non-contact method 100 to measure corona discharge at a remote distance is shown in accordance with an example embodiment of the invention. The method 100 comprises the steps of providing, at block 102, an optical detector device 54 as hereinbefore described. The detector 54 is typically in use provided adjacent and at a determined or prescribed distance from the corona discharge source in order to measure quantitatively and remotely the magnitude thereof. As mentioned, the detector 54 may form part of the camera apparatus 10 to visually determine, in real-time, the magnitude of the discharge of the corona, which may for example be provided in an image still or video generated by the means 62. It will be noted that the method 100 may be described specifically with reference to system 50 of FIG. 3.

The method 100 comprises determining, at block 104, anode current Ia associated with the anode 60, for example, via the module 64.

The method 100 then comprises determining, at block 106, input irradiance to the device 54 by using the determined anode current Ia and predetermined calibration data, stored in the device 68. The calibration data may comprise a calibration curve of anode current Ia versus input irradiance such that a corresponding input irradiance is read from the calibration curve by using the determined anode current Ia as an input thereto. The calibration curve is conveniently determined during calibration of the device 54 and hence the system 50 as hereinbefore described. The method 100 may comprise the prior step of setting the gain G to a maximum before determining input irradiance.

The method 100 may then comprise determining, at block 108, a quantitative measurement associated with the magnitude of the electrical discharge by using the determined amount of input optical radiation received by the optical detector device 54, for example, in a manner as described above with reference to the module 74. This step is important as the input irradiance is the power received and the photocathode 56 and not necessarily of much use to a user whereas the quantitative measurement associated with the magnitude of the electrical discharge is associated with the actual optical power loss by the equipment at the location of the corona discharge, which information may be used to determine, for example, the severity of a fault, etc.

It will be noted that the method 100 may further comprise the prior step of calibrating the anode current Ia of the device 54 to the input irradiance with the gain at the maximum thereby at least to obtain the calibration data.

Figure 12:
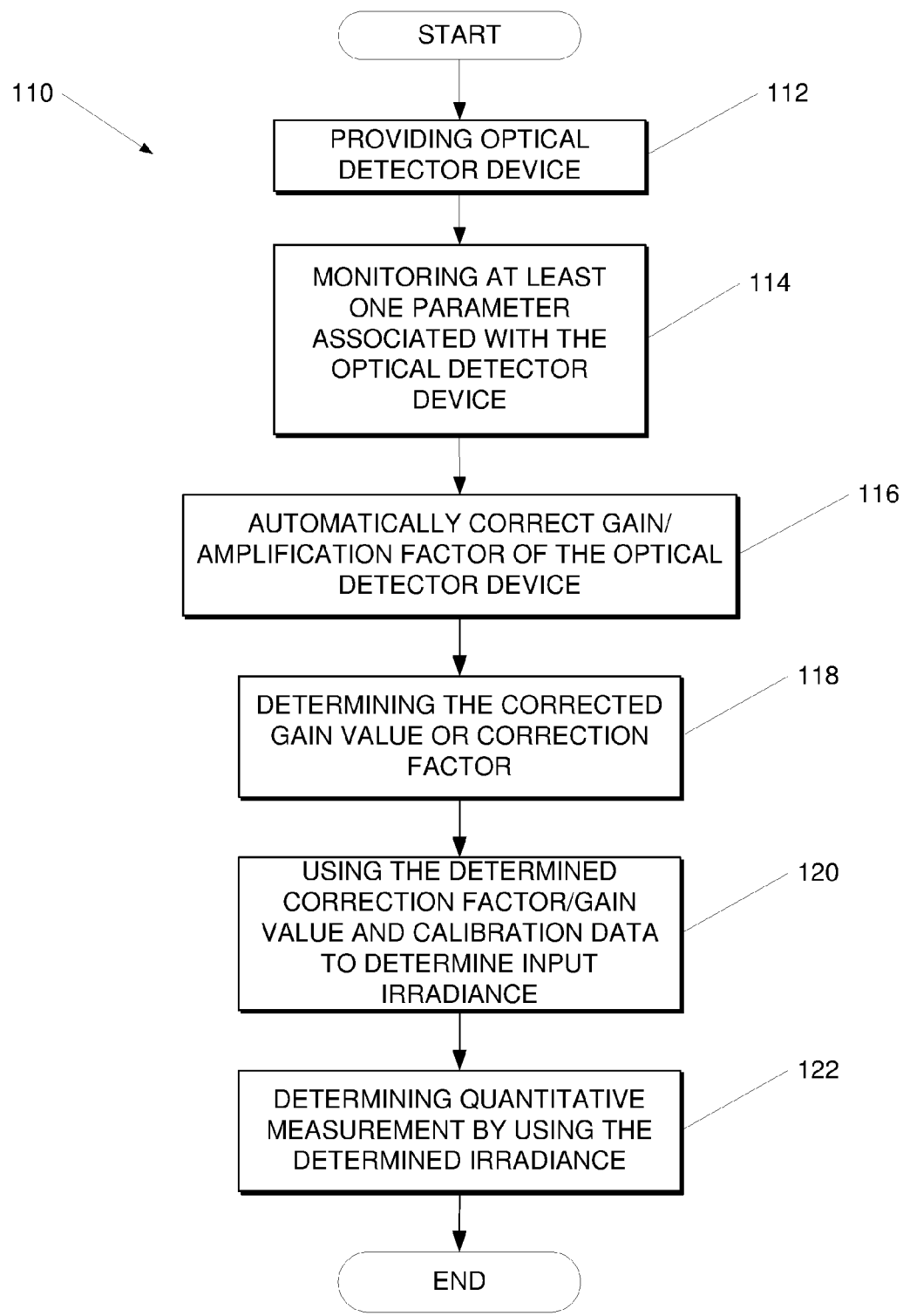
FIG. 12 shows another high level flow diagram of a method in accordance with an example embodiment of the invention.

Turning to FIG. 12 of the drawings where a flow diagram of another method in accordance with the invention is generally indicated by reference numeral 110. Where applicable, some comments made above with reference to FIG. 11 apply to equally to the discussion of FIG. 12. In addition, it will be noted that the method 110 will be described with reference to system 80 of FIG. 4.

The method 110 comprises providing, at block 112, an optical detector device 54 in a similar fashion as step 102 of the method 100.

The method 110 comprises receiving or monitoring, at block 114 (e.g., via the module 84), at least one of the detector output and anode current associated with the optical detector device 54 to determine variations of the received or monitored detector output and/or anode current relative to an associated predetermined calibration set point in response to exposure of the optical detector device 54 to the corona discharge.

The method 110 then comprises automatically correcting, at block 116 by way of the module 86, the gain G of the optical detector device 54 to a corrected gain value or by a correction factor in response to variations of the received detector output thereby to maintain a predetermined relationship between the received detector output and the corresponding calibration set point. The method 110 may comprise the step of determining, at block 118, the corrected gain value or correction factor by way of the module 88 as described above.

The method 110 then comprises the step of using, at block 120, the determined corrected gain value or correction factor as an input to the calibration data stored in the device 68 associated with the calibration set point associated with the monitored or received detector output to determine the corresponding input irradiance received by the device 54 in a manner as hereinbefore described with reference to the module 74 of system 80.

The method 110 then comprises the step of determining, at block 122, a quantitative measurement associated with the magnitude of the electrical discharge by way of module 74 in a manner as hereinbefore described.

Figure 13:
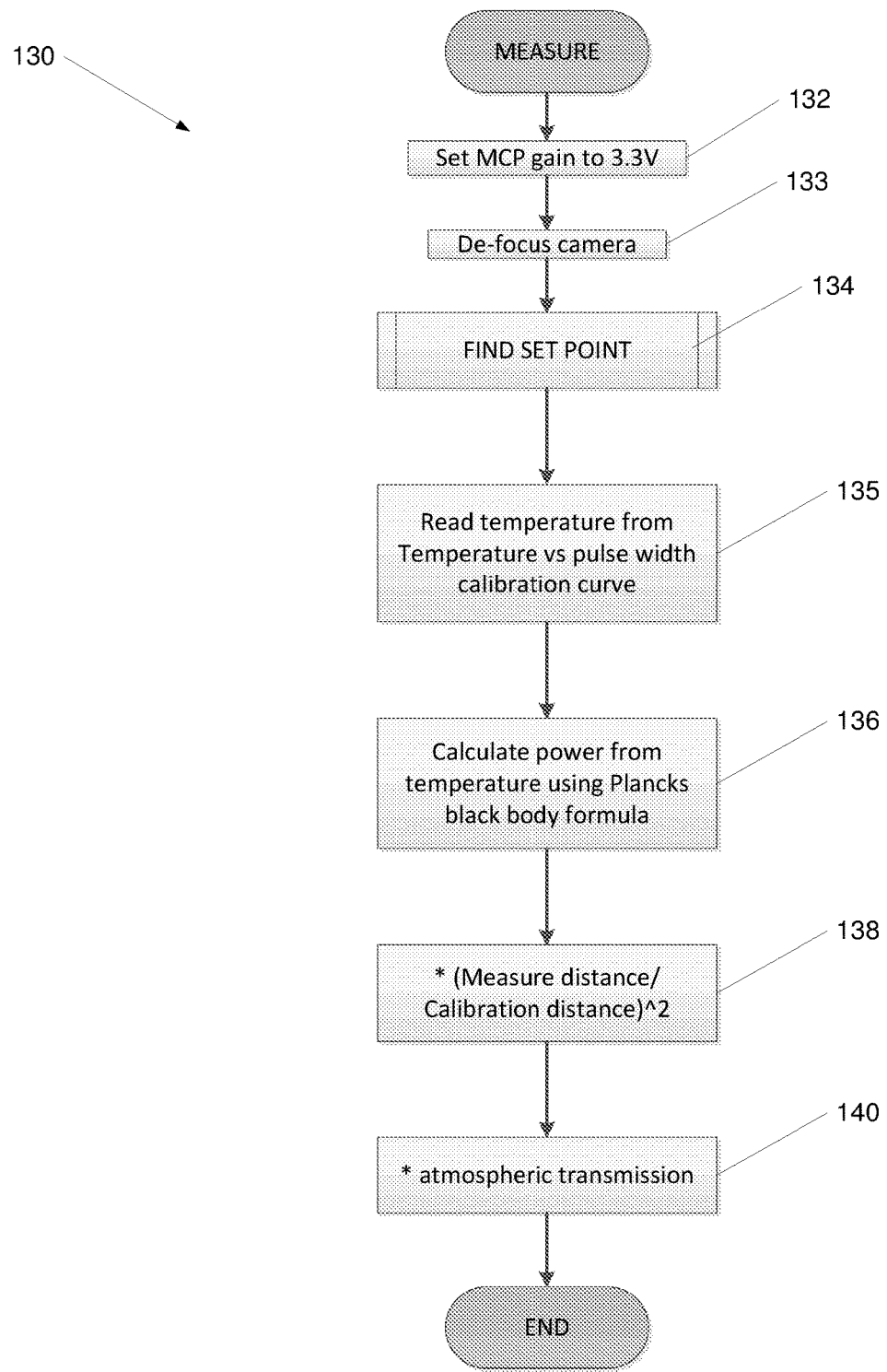
FIG. 13 shows a low level flow diagram of a method of measuring corona discharge in accordance with an example embodiment of the invention.
Figure 14:
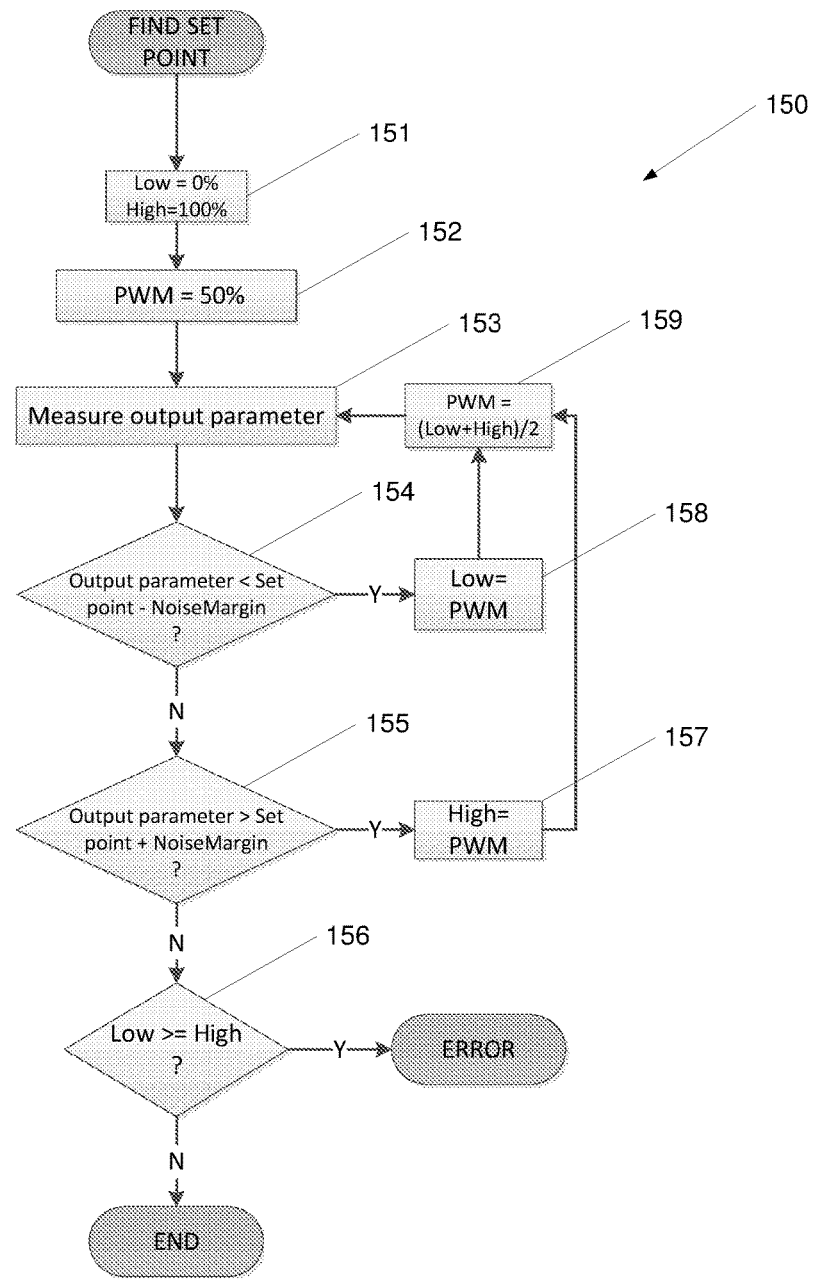
FIG. 14 shows a low level flow diagram of a method of finding the set point in accordance with an example embodiment of the invention.

Referring to FIG. 13 of the drawings where another flow diagram of a method of measuring or determining corona discharge quantitatively, is generally indicated by reference numeral 130. The method 130 may be a more low level explanation of the method 110 of FIG. 12. However, it will be appreciated that this need not necessarily be the case. As mentioned above, there may be a few detector outputs which may be monitored, for example by way of the system 80 to determine corona discharge quantitatively. Though in some example embodiments these detector outputs may be user selected, in some example embodiments, these are determined automatically or autonomously depending on operating conditions, etc. associated with the system 80.

In any event, the method 130 comprises setting, at block 132, the Microchannel plate (MCP) gain voltage to a constant voltage. The image intensifier or optical detector gain is adjusted by varying the gate pulse width (PWM) instead of the gain voltage. The advantage of this is that the blob size and intensity then remains independent of the image intensifier gain.

The method 130 then comprises defocusing, at block 133, the camera if the detector output is a photon count or blob area count as this simplifies the image counting process. It will be noted that for anode current and MCP event count output parameters defocussing is not required. In block 134, the set point is found and the gate pulse width required to achieve the set point area for any source power is automatically determined. In this regard, reference will now also be made to FIG. 14 wherein a flow diagram of a method to determine a set point is illustrated and generally indicated by reference numeral 150.

In particular two variables are maintained (Low and High), at block 151, which determine the lower and higher limit for gate pulse width within which the binary search to determine the set point is performed.

The gate pulse width (PWM) is set, at block 152, to 50%.

The detector output/output parameter or anode current is then measured, at block 153. The detector output may comprise the total photon blob area (the preferred parameter), the photon count, the MCP event count. The blob area, photon count and MCP event count are measured by averaging the parameters over 80 video frames. The anode current may be read directly as it is already averaged.

If the output parameter is less than the set point (within noise limits), at block 154, then the gate pulse width will be increased.

If the output parameter is greater than the set point (within noise limits), at block 155, then the gate pulse width will be decreased.

At block 156, if the lower PWM limit is greater than or equal to the higher PWM limit an error is signalled as the set point could not be found.

It will be noted that the higher limit for the gate pulse width search is decreased, at block 157, to the current gate pulse width. The lower limit for the gate pulse width search may be increased, at block 158, to the current gate pulse width.

A new value for the gate pulse width is chosen, at block 159, to be half way between the lower and upper limits.

Returning to FIG. 13, the gate pulse width found in FIG. 12 described above is used, at block 135, to interpolate the calibration graph or data in accordance with invention to determine the "corona temperature".

The determined temperature is then used, at block 136, 137, 138, to calculate power in Watts using Planck's Black Body Formula:

Total emittance =

$$\underbrace{\int_{240\,nm}^{280\,nm} \frac{2\pi h c^2}{\lambda^5 \left(e^{\frac{hc}{\lambda kT}} - 1\right)}}_{Plancks's\ law} * \underbrace{\pi r^2}_{Black\ body\ aperture} * \underbrace{1/\tau_o}_{AtmTransmission} * \underbrace{\left(\frac{d}{d_c}\right)^2}_{Inverse\ square\ law}$$

Figure 15:
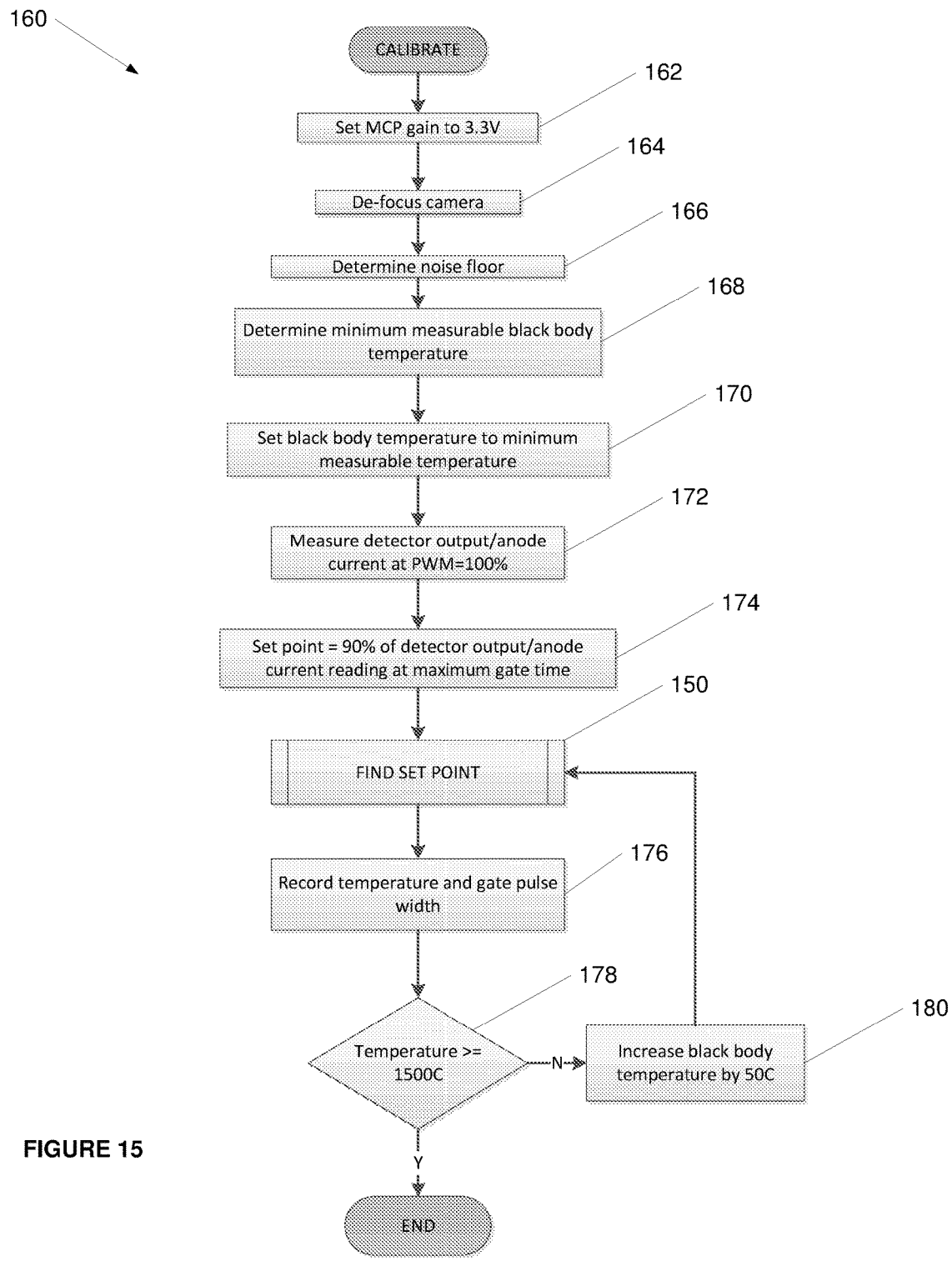
FIG. 15 shows a low level flow diagram of a method of calibrating the optical detector device in accordance with an example embodiment of the invention.

Referring to FIG. 15 of the drawings where another flow diagram of a method 160 is shown. The method 160 may be a method to calibrate the system 80 to obtain at least calibration data. The method 160 may be used for all detector outputs and/or anode current as described above. However, it will be discussed broadly without specific reference to any particular detector output unless indicated otherwise. In certain example embodiments not described further, the calibration may be used for a range of set points for each detector output such that each detector output has a range of calibration set points with each set point having associated calibration data such as calibration curves, look-up tables, etc. associated therewith.

In any event, it will be noted that the Microchannel plate (MCP) gain voltage is set, at block 162, to a constant voltage. As mentioned above, the image intensifier or optical detector gain can then be adjusted by varying the gate pulse width (PWM) instead of the gain voltage. The advantage of this is that the blob size and intensity then remains independent of the image intensifier gain.

It will be noted that the method 160 is used to calibrate the camera as hereinbefore described. The method 160 therefore comprises defocusing, at block 164, the camera if the detector output is a photon count or blob area count as this simplifies the image counting process. For anode current and MCP event count, defocussing is not required.

At block 166, the noise floor of the camera is determined by covering the front lens and ramping the gate pulse width modulated (PWM) signal from 0% to 100% while measuring the detector output or anode current at each gate pulse width. This gives the dark noise for each PWM setting.

At block 168, the minimum measurable black body temperature is determined by setting the PWM to 100% and gradually increasing the black body temperature until a parameter reading of 10% above the noise floor is reached. The minimum measurable temperature is affected mainly by the camera optics.

The method 160 comprises setting, at block 170, the Black Body temperature to minimum measurable temperature.

At block 172, the detector output and/or anode current is determined at maximum PWM (100%).

The set point is chosen, at block 174, to be 90% of the parameter measured in step 172. It will be understood that the detector output and/or the anode current may be seen to be output parameters in the context of the specification. The anode current may be amplified by the system described herein via suitable circuitry in order to measure the same.

The method 160 then proceeds as per the method 150 as described above, wherein the gate pulse width required to achieve the set point for any source power is automatically determined.

The temperature and gate pulse width are recorded as one calibration point, at block 176, as part of the calibration data for the camera. Which data is stored in a look-up table, or the like.

It will be appreciated from blocks 178 and 180, the calibration will continue until the black body temperature reaches 1500° C. to generate a plurality of temperatures versus PWM to maintain the set point.

The distance between the calibration source and the optical detector or image intensifier is recorded in order to use the same to calculate the power of electrical discharge measured. This may involve, during measurement, multiplying the determined power of the electrical discharge by a square of a distance quotient, wherein the distance quotient is a quotient of the determined distance between the optical detector and the electrical discharge, and a calibrated distance between the optical detector and an electrical discharge source with which the optical detector was calibrated as described herein.

By using the method 160, the system 80 is calibrated to obtain calibration data which facilitates quick processing in determining corona discharges quantitatively.

It will be understood that calibration of either the system 50 or 80 as hereinbefore described effectively involves the calibration of the camera apparatus 10 as herein described.

Figure 16:
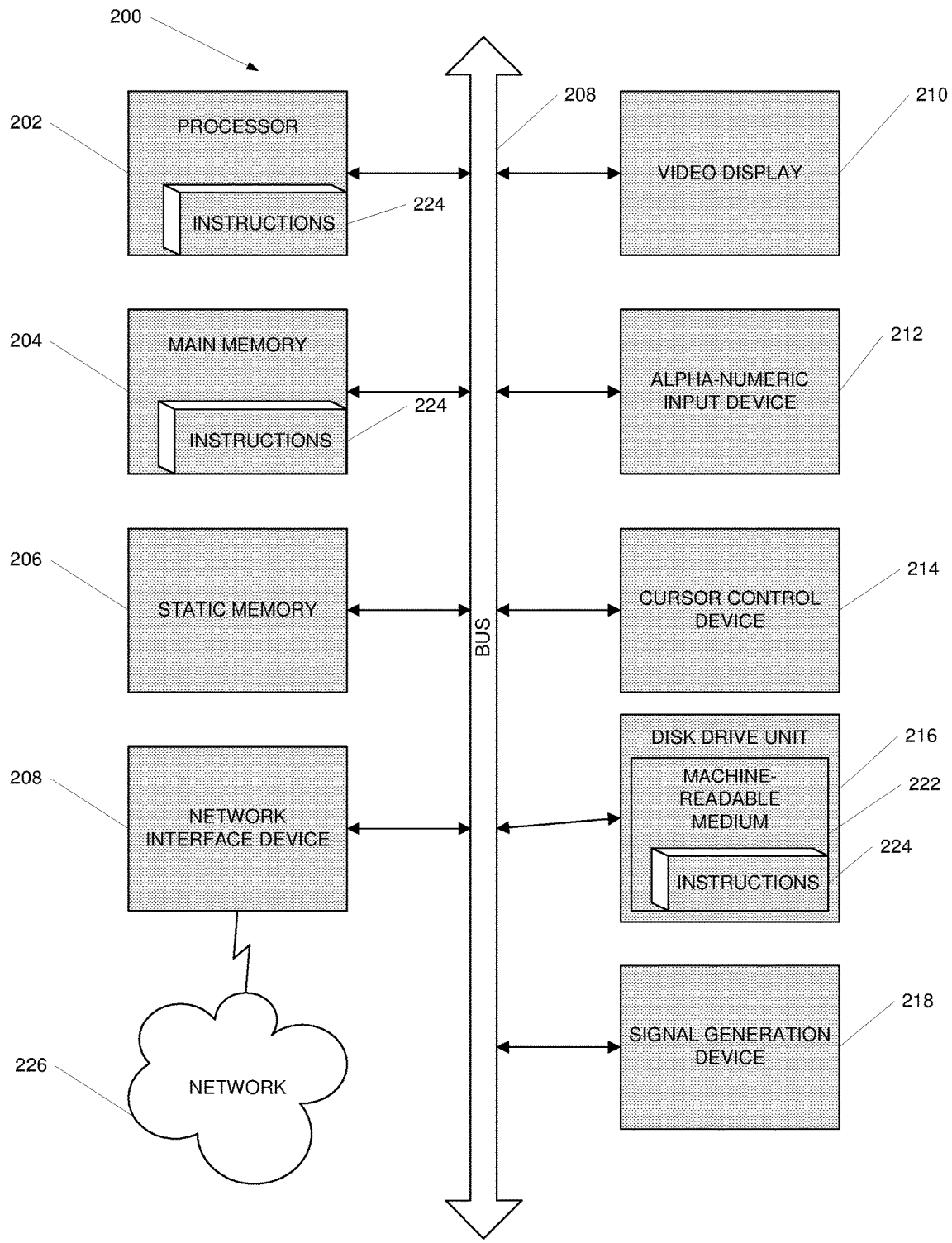
FIG. 16 shows a diagrammatic representation of a machine in the example form of a computer system in which a set of instructions for causing the machine to perform any one or more of the methodologies discussed herein, may be executed.

FIG. 16 shows a diagrammatic representation of machine in the example of a computer system 200 within which a set of instructions, for causing the machine to perform any one or more of the methodologies discussed herein, may be executed. In other example embodiments, the machine operates as a standalone device or may be connected (e.g., networked) to other machines. In a networked example embodiment, the machine may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated for convenience, the term "machine" shall also be taken to include any collection of machines that individually or jointly execute a set (or multiple sets) of instructions to perform any one or more of the methodologies discussed herein.

In any event, the example computer system 200 includes a processor 202 (e.g., a central processing unit (CPU), a graphics processing unit (GPU) or both), a main memory 204 and a static memory 206, which communicate with each other via a bus 208. The computer system 200 may further include a video display unit 210 (e.g., a liquid crystal display (LCD) or a cathode ray tube (CRT)). The computer system 200 also includes an alphanumeric input device 212 (e.g., a keyboard), a user interface (UI) navigation device 214 (e.g., a mouse, or touchpad), a disk drive unit 216, a signal generation device 218 (e.g., a speaker) and a network interface device 220.

The disk drive unit 216 includes a machine-readable medium 222 storing one or more sets of instructions and data structures (e.g., software 224) embodying or utilised by any one or more of the methodologies or functions described herein. The software 224 may also reside, completely or at least partially, within the main memory 204 and/or within the processor 202 during execution thereof by the computer system 200, the main memory 204 and the processor 202 also constituting machine-readable media.

The software 224 may further be transmitted or received over a network 226 via the network interface device 220 utilising any one of a number of well-known transfer protocols (e.g., HTTP).

Although the machine-readable medium 222 is shown in an example embodiment to be a single medium, the term "machine-readable medium" may refer to a single medium or multiple media (e.g., a centralized or distributed database, and/or associated caches and servers) that store the one or more sets of instructions. The term "machine-readable medium" may also be taken to include any medium that is capable of storing, encoding or carrying a set of instructions for execution by the machine and that cause the machine to perform any one or more of the methodologies of the present invention, or that is capable of storing, encoding or carrying data structures utilised by or associated with such a set of instructions. The term "machine-readable medium" may accordingly be taken to include, but not be limited to, solid-state memories, optical and magnetic media, and carrier wave signals.

The present invention which effectively calibrates the detector device 54 in a fixed state (constant anode current Ia or constant MCP count) regardless of the input irradiance conveniently seeks to, eliminate problems with photon counting due to overlapping photons in the image, eliminate problems associated with individual microchannel plate channels having differing gains which can result in some photons being invisible in the image. The present invention provides a convenient means to detect and quantify corona discharge in a non-contact manner.

The invention claimed is:

1. An apparatus for detecting and measuring an electrical discharge having a discharge magnitude, wherein the electrical discharge causes a corresponding emission of optical radiation, wherein the apparatus comprises:
   an optical receiver arrangement configured to receive optical radiation from a scene comprising a source of a potential electrical discharge;
   a first image forming means configured to form an image based on the optical radiation received by the optical receiver arrangement;
   a measurement system, wherein the measurement system comprises:
      an optical detector optically coupled to the optical receiver arrangement to receive and process the optical radiation from the optical receiver arrangement to generate a detector output;
      a memory device storing pre-determined calibration data comprising calibrated quantitative measurement values associated with magnitudes of electrical discharge and detector parameters corresponding thereto, the detector parameters being operating parameters associated with the optical detector; and
      a quantitative measurement module configured to receive and process a particular detector parameter with the stored calibration data thereby to detect an electrical discharge, and determine a quantitative measurement associated with the magnitude of the detected electrical discharge;
   a display device for displaying images formed by the first image forming means; and
   an image processor configured to overlay the determined quantitative measurement onto the image displayed by the display device.

2. An apparatus as claimed in claim 1, wherein the quantitative measurement module is configured to process the received detector parameter with the stored calibration data by:
   comparing the received detector parameter with detector parameters forming part of the calibration data;
   retrieving, upon a match, a calibrated quantitative measurement value corresponding to the matching detector parameter, wherein a match results in a detection of an electrical discharge, and
   optionally use the retrieved calibrated quantitative measurement value to determine the quantitative measurement associated with the magnitude of the detected electrical discharge.

3. An apparatus as claimed in claim 1, wherein the apparatus is in the form of a portable camera comprising a power supply; portable housing defining at least one optical aperture such that optical radiation emanating from outside the portable housing enters the housing, wherein the housing encloses the components of the apparatus; and at least one eye piece visually alignable with the display device to permit viewing of the same.

4. An apparatus as claimed in claim 1, wherein the optical receiver arrangement comprises:
   a light-collector comprising one or more optical lenses and/or filters to receive optical radiation; and
   a beam splitter optically coupled to the light-collector and configured to reflect all or part of the spectrum of the received optical radiation to the first image forming means and to the measurement system.

5. An apparatus as claimed in claim 1, wherein the apparatus is calibrated to a calibration source of optical radiation, the calibrated quantitative measurement values being one or more of temperature, irradiance, and power associated with the calibration source; and wherein the detector parameters forming part of the calibration data correspond to the calibrated quantitative measurement values.

6. An apparatus as claimed in claim 1, wherein the optical detector comprises a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output.

7. An apparatus as claimed in claim 6, wherein the apparatus comprises a second image forming means operatively connected to the anode of the optical detector to form an image of the photons output thereby, wherein the image processing means is configured to overlay the image formed by the second image forming means onto the image formed by the first image forming means.

8. An apparatus as claimed in claim 6, wherein the measurement system comprises a current measuring module configured to determine an electrical parameter associated with one of the photocathode and the anode in processing received optical radiation to output photons, and wherein the particular detector parameter received by the quantitative measurement module is the determined electrical parameter.

9. An apparatus as claimed in claim 8, wherein the electrical parameter is anode current drawn by the anode of the optical detector in processing the received optical radiation to generate the detector output such that the calibration data comprises a plurality of anode current values and corresponding calibrated quantitative measurement values associated with magnitudes of electrical discharges.

10. An apparatus as claimed in claim 6, wherein the memory device stores a pre-determined calibration set point associated with the detector output and/or an electrical parameter associated with one of the photocathode and the anode in processing received optical radiation to generate the detector output, wherein the measurement system comprises:
 a parameter monitoring module configured to receive information indicative of the detector output and/or the electrical parameter to determine variations of the same from the respective calibration set point; and
 a gain controller module configured to correct or adjust a detector parameter of the optical detector to a corrected detection parameter in response to determining variation of the received detector output and/or electrical parameter from the respective calibration set point so as to maintain a predetermined relationship between detector output and/or electrical parameter and the corresponding calibration set point/s,
 wherein the particular detector parameter receivable for processing by the quantitative measurement module is the corrected detection parameter, and wherein the calibration data comprises detector parameters and corresponding calibrated quantitative measurement values associated with magnitudes of electrical discharges at which the predetermined relationship between the detector output and/or the electrical parameter and the corresponding calibration set point/s is maintained.

11. A method of measuring an electrical discharge having a discharge magnitude, wherein the electrical discharge causes a corresponding emission of optical radiation, wherein the method comprises:
 storing, in a memory device, a pre-determined calibration set point for a detector output and/or an electrical parameter associated with an optical detector, wherein the electrical parameter is associated with the operation of the optical detector;
 storing in the memory device, pre-determined calibration data comprising calibrated quantitative measurement values associated with magnitudes of electrical discharges and corresponding detector parameters associated with operation of the optical detector, wherein the detector parameters forming part of the calibration data are selected to maintain the detector output and/or electrical parameter at the pre-determined calibration set point;
 receiving information indicative of a monitored detector output and/or electrical parameter,
 determining variations of the monitored detector output and/or electrical parameter relative to the associated predetermined calibration set point stored in the memory device in response to exposure of the optical detector to the emission of optical radiation from the electrical discharge;
 correcting or adjusting, if variations are determined, a detector parameter associated with the operation of the optical detector device to a corrected detector parameter so as to maintain the detector output and/or the electrical parameter at the corresponding calibration set point; and
 using the corrected detector parameter and the stored calibration data to determine a quantitative measurement associated with the magnitude of the electrical discharge.

12. A method as claimed in claim 11, wherein the detector parameter is a detector gain value or pulse width value associated with the overall time averaged gain of the optical detector, wherein the detector output is or is related to a number of photons output by the optical detector, and wherein the calibrated quantitative measurement values comprise one of temperature and irradiance values associated with electrical discharges, the method comprising using the corrected detector gain value together with the predetermined calibration data to determine an amount of input irradiance and/or temperature associated with the electrical discharge received by the optical detector.

13. A method as claimed in claim 11, wherein the method comprises a step of providing the optical detector device, the optical detector device comprising a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output, wherein the electrical parameter is anode current drawn by the anode of the optical detector in processing the received optical radiation to generate the detector output, the method therefore comprising determining the anode current.

14. A method as claimed in claim 11, wherein the method comprises:
 using the corrected detector parameter as an input to the calibration data to determine the associated calibrated quantitative measurement value related to the input optical radiation received by the optical detector by matching the corrected detector parameter to one stored in the calibration data and retrieving the calibration quantitative measurement value associated therewith;

determining or measuring a distance to the electrical discharge or source thereof from the optical detector; and determining the quantitative measurement associated with the magnitude of the electrical discharge by multiplying the retrieved calibrated quantitative measurement value by a square of a distance quotient, wherein the distance quotient is a quotient of the determined distance between the optical detector and the electrical discharge, and a calibrated distance between the optical detector and a source of electrical discharge to which the optical detector was calibrated.

15. A method as claimed in claim 14, wherein the method comprises:

using the retrieved calibrated quantitative measurement value together with Planck's Black Body Formula:

$$\text{Total emittance} = \underbrace{\int_{240\,nm}^{280\,nm} \frac{2\pi hc^2}{\lambda^5 \left(e^{\frac{hc}{\lambda kT}} - 1\right)}}_{\text{Plancks's law}} * \underbrace{\pi r^2}_{\text{Black body aperture}} * \underbrace{1/\tau_o}_{\text{AtmTransmission}} * \underbrace{\left(\frac{d}{d_c}\right)^2}_{\text{Inverse square law}}.$$

to determine the power of the electrical discharge.

16. A method as claimed in claim 11, wherein the method comprises calibrating the optical detector device by:

determining a calibration set point for the detector output and/or the electrical parameter; and calibrating the detector parameter against varying input optical radiation to keep the detector output and/or electrical parameter of the optical detector constant at the determined calibration set point, wherein the step of calibrating comprises determining the calibration data by determining and storing calibrated quantitative measurement values associated with magnitudes of varying input electrical discharge associated with a calibration source of electrical discharge, and determining and storing associated detector parameters required to keep the detector output and/or electrical parameter constant at the determined set point for each determined and stored calibrated quantitative measurement value.

17. A method of measuring an electrical discharge having a discharge magnitude, wherein the electrical discharge causes a corresponding emission of optical radiation, the method comprising:

providing an optical detector to receive and process the optical radiation from the optical receiver arrangement to generate a detector output;

storing, in a memory device, pre-determined calibration data comprising calibrated quantitative measurement values associated with magnitudes of electrical discharge and detector parameters corresponding thereto, the detector parameters being operating parameters associated with the optical detector; and receiving and processing a particular detector parameter with the stored calibration data thereby to determine a quantitative measurement associated with the magnitude of the detected electrical discharge.

18. A method as claimed in claim 17, wherein the detector parameter is an electrical parameter associated with the operation of the optical detector, wherein the detector output is or is related to a number of photons output by the optical detector, and wherein the calibrated quantitative measurement values comprise one of temperature and irradiance values associated with electrical discharges.

19. A method as claimed in claim 17, wherein the optical detector comprises a photocathode operable to convert photons from the received optical radiation to photo-electrons, a multiplier means coupled to the photocathode operable to apply a gain to the photo-electrons to amplify the same; and an anode configured to convert the amplified electrons to output photons as the detector output, wherein the method comprises determining the electrical parameter, wherein the electrical parameter is the current drawn by the anode and/or photocathode of the optical detector in providing the detector output, in use.

20. A method as claimed in claim 19, the method comprising:

using the determined electrical parameter as an input to the calibration data to determine the associated calibrated quantitative measurement value related to the input optical radiation received by the optical detector by matching the determined electrical parameter to one stored in the calibration data and retrieving the calibration quantitative measurement value associated therewith;

determining or measuring a distance to the electrical discharge or source thereof from the optical detector; and determining the quantitative measurement associated with the magnitude of the electrical discharge by multiplying the retrieved calibrated quantitative measurement value by a square of a distance quotient, wherein the distance quotient is a quotient of the determined distance between the optical detector and the electrical discharge, and a calibrated distance between the optical detector and a source of electrical discharge to which the optical detector was calibrated.

* * * * *